US011294297B2

(12) United States Patent
Seki

(10) Patent No.: US 11,294,297 B2
(45) Date of Patent: Apr. 5, 2022

(54) IMAGE FORMING APPARATUS WITH SEPARATE LIGHT EMITTING ELEMENT ARRAYS

(71) Applicant: CANON KABUSHIKI KAISHA, Tokyo (JP)

(72) Inventor: Hirotaka Seki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/124,120

(22) Filed: Dec. 16, 2020

(65) Prior Publication Data

US 2021/0103231 A1 Apr. 8, 2021

Related U.S. Application Data

(63) Continuation of application No. PCT/JP2019/025427, filed on Jun. 26, 2019.

(30) Foreign Application Priority Data

Jun. 27, 2018 (JP) .............................. JP2018-121823

(51) Int. Cl.
*G03G 15/04* (2006.01)
*G03G 15/32* (2006.01)

(52) U.S. Cl.
CPC . *G03G 15/04036* (2013.01); *G03G 15/04054* (2013.01); *G03G 15/326* (2013.01); *G03G 2215/0409* (2013.01)

(58) Field of Classification Search
CPC ............. G03G 15/04036; G03G 15/04; G03G 15/04054; G03G 15/326; G03G 15/344;
(Continued)

(56) References Cited

U.S. PATENT DOCUMENTS 6,831,673 B2 * 12/2004 Wakisaka ................. B41J 2/451
347/238
2006/0192843 A1 * 8/2006 Ohba ....................... B41J 2/451
347/238
(Continued)

FOREIGN PATENT DOCUMENTS

JP 2001-010110 A 1/2001
JP 2008-182010 A 8/2008
(Continued)

OTHER PUBLICATIONS

International Preliminary Report on Patentability dated Jan. 7, 2021, in International Application No. PCT/JP2019/025427.
(Continued)

*Primary Examiner* — Walter L Lindsay, Jr.
*Assistant Examiner* — Laura Roth
(74) *Attorney, Agent, or Firm* — Venable LLP

(57) ABSTRACT

An image forming apparatus includes an exposure head having an odd number of chips in each of which a plurality of light emitting elements configured to expose a photosensitive member are arrayed at intervals corresponding to a first resolution in an intersecting direction intersecting with a rotation direction of the photosensitive member. An even number of chips of the odd number of chips are arranged on one side of the printed circuit board in the rotation direction, and a remaining odd number of chips of the odd number of chips are arranged on another side of the printed circuit board. A center of an intensity of a light amount of the odd number of chips in the rotation direction is shifted to a side of the even number of chips with respect to a center of the printed circuit board in the rotation direction.

3 Claims, 11 Drawing Sheets

(58) Field of Classification Search
CPC ... G03G 2215/0407; G03G 2215/0409; G03G 2215/0412; G03G 2215/0451; G03G 2215/0453; G03G 2215/0456; B41J 2/45; B41J 2/447; H01L 33/62; G03F 7/20
See application file for complete search history.

(56) References Cited

U.S. PATENT DOCUMENTS

2008/0252713 A1* 10/2008 Horikawa ............ G03G 15/326
347/237
2015/0191011 A1 7/2015 MacKenzie et al.
2021/0048761 A1* 2/2021 Furuta .................. B41J 2/447

FOREIGN PATENT DOCUMENTS

| JP | 2009-218602 A | 9/2009 |
| JP | 2009274447 A * | 11/2009 |
| JP | 2019-098548 A | 6/2019 |

OTHER PUBLICATIONS

International Search Report dated Sep. 3, 2019, in International Application No. PCT/JP2019/025427.

* cited by examiner

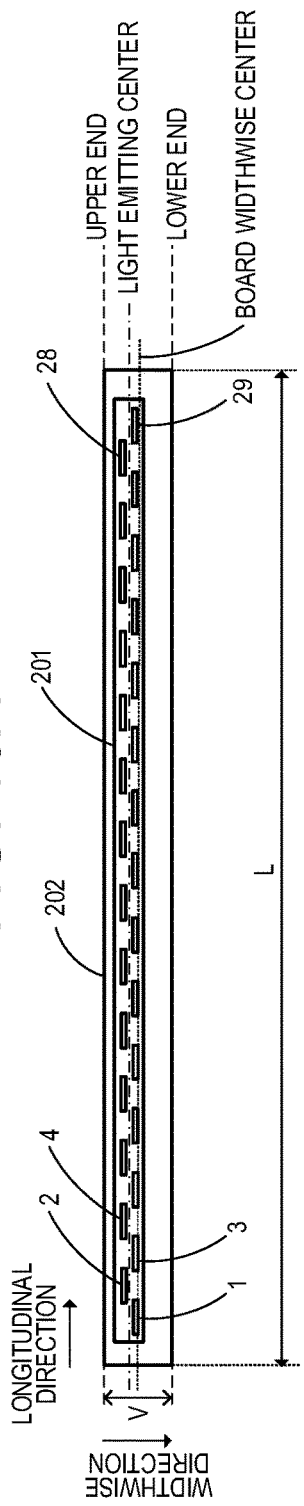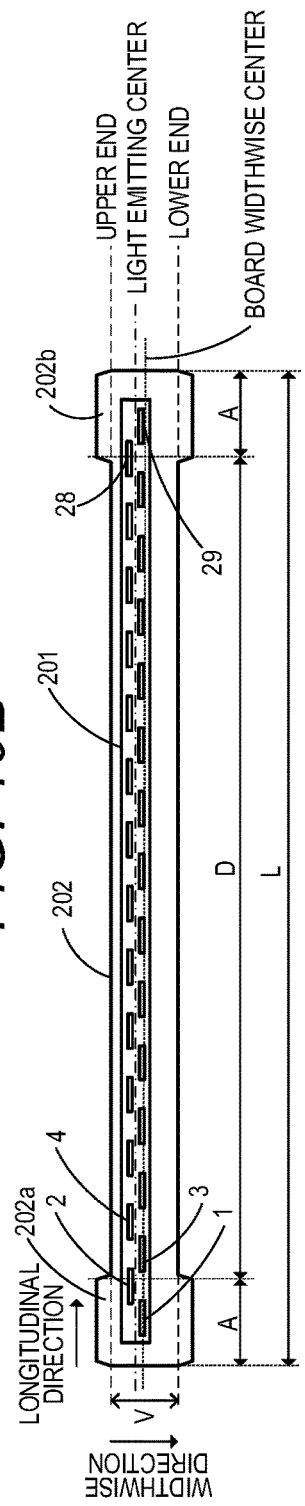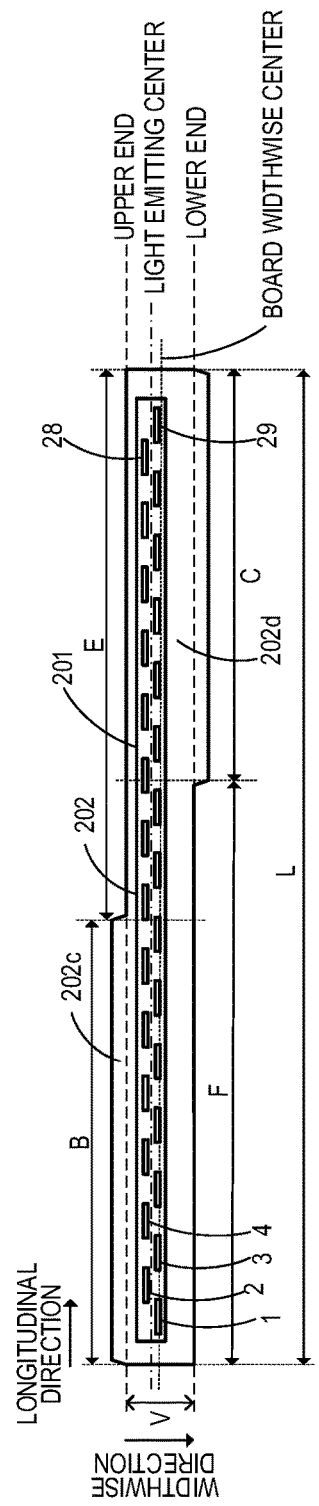

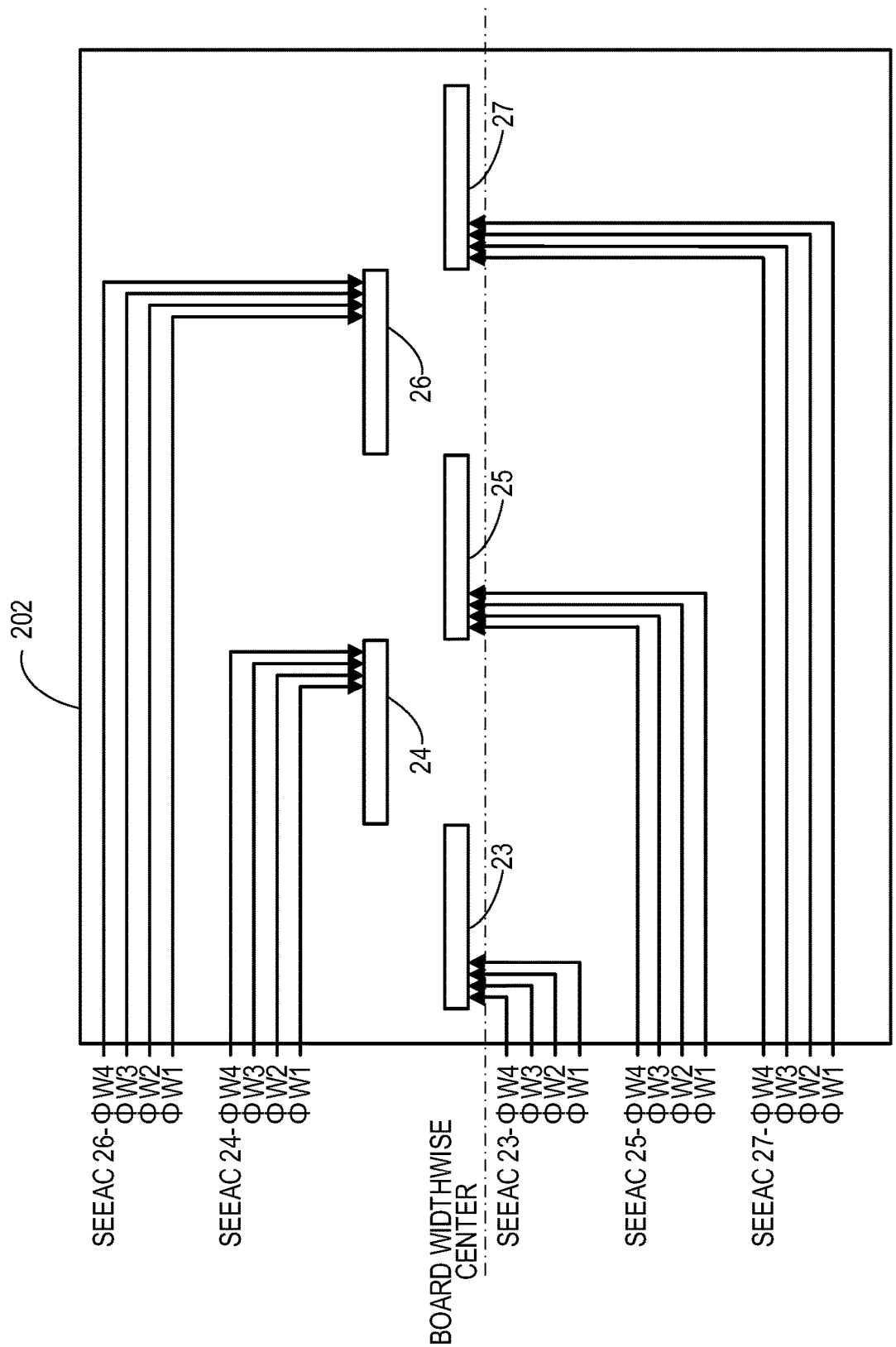

IMAGE FORMING APPARATUS WITH SEPARATE LIGHT EMITTING ELEMENT ARRAYS

CROSS-REFERENCE TO RELATED APPLICATIONS

This application is a Continuation of International Patent Application No. PCT/JP2019/025427, filed Jun. 26, 2019, which claims the benefit of Japanese Patent Application No. 2018-121823, filed Jun. 27, 2018, both of which are hereby incorporated by reference herein in their entirety.

BACKGROUND OF THE INVENTION

Field of the Invention

The present invention relates to an image forming apparatus, and more particularly, to an electrophotographic image forming apparatus.

DESCRIPTION OF THE RELATED ART

With regard to a printer being an electrophotographic image forming apparatus, there is generally known a method of exposing a photosensitive drum through use of an exposure head adopting, for example, a light emitting diode (LED) or an organic electroluminescent (organic EL) diode (OLED), to thereby form a latent image on the photosensitive drum. The exposure head includes rows of light emitting elements arranged in a longitudinal direction of the photosensitive drum and a rod lens array configured to cause light beams from the rows of light emitting elements to form an image on the photosensitive drum. A known configuration of the LED or the organic EL diode has a surface emitting shape, in which a direction of illuminating light from a light emitting surface is matched with a direction of the rod lens array. A length of each of the rows of the light emitting elements is determined by a width of an image region on the photosensitive drum, and intervals between the light emitting elements are determined by a resolution of the printer. For example, in the case of a 1,200 dpi printer, intervals between pixels are 21.16 μm, which corresponds to the resolution, and accordingly the intervals between the light emitting elements have values corresponding to 21.16 μm.

When such intervals between the light emitting elements are set to 21.16 μm, in a case of an image forming apparatus capable of performing printing of an A3 size (about 300 mm), 14,173 light emitting elements are arrayed in the longitudinal direction. When discrete light emitting elements are mounted on a printed circuit board by wire bonding, the number of bonding wires increases as the number of light emitting elements increases, and hence mounting cost increases. The related art thus employs a method for reducing the number of bonding wires. Specifically, a plurality of light emitting elements are formed on one semiconductor chip to form a light emitting element array, and the light emitting elements share terminals in the semiconductor chip. For example, in a case in which 500 light emitting elements are formed on one semiconductor chip, when 29 light emitting element arrays are mounted on the printed circuit board, the number of light emitting elements is 14,500 (=500×29), and thus the image region width of 300 mm can be secured. Further, the number of bonding wires (mounting number) can be reduced. A printer using such an exposure head uses fewer components than those used in a laser scanning printer, in which a photosensitive drum is scanned with a laser beam deflected by a rotary polygon mirror. Therefore, it is easier to reduce the size and cost of the apparatus. In addition, in the printer using the exposure head, sound resulting from the rotation of the rotary polygon mirror is reduced.

The light emitting element arrays and drive circuit elements configured to drive the light emitting element arrays are integrally arranged on the printed circuit board. Each of the light emitting element arrays receives a drive signal from a drive circuit through wiring patterns and the bonding wires formed on the printed circuit board so that lighting thereof is controlled. For example, in Japanese Patent Application Laid-Open No. 2008-182010, there is disclosed the following wiring for reducing the size of the printed circuit board. A plurality of light emitting element arrays are arranged in a staggered configuration in a longitudinal direction of the printed circuit board. Further, signal lines for transmitting drive signals to light emitting element arrays arranged on one side in a widthwise direction of the printed circuit board are wired on the printed circuit board on one side portion side on which the corresponding light emitting element arrays are arranged. Meanwhile, signal lines for transmitting drive signals to light emitting element arrays arranged on another side in the widthwise direction of the printed circuit board are wired on the printed circuit board on another side portion side on which the corresponding light emitting element arrays are arranged.

As in the related art, when an even number of light emitting element arrays (for example, 30 light emitting element arrays) are to be arranged on the printed circuit board, the wiring patterns and the bonding wires are arranged to be equally distributed in the widthwise direction of the printed circuit board. Thus, the length of the printed circuit board can be equally divided with respect to the light emitting element arrays arranged on the printed circuit board at the center. However, when an odd number of light emitting element arrays (for example, 29 light emitting element arrays) are to be mounted, the following configuration is required. When the total number of light emitting element arrays is an odd number, in order to equally divide the widthwise direction of the printed circuit board with respect to the light emitting element arrays arranged at the center as in the case in which the number of light emitting element arrays is an even number, the length in the widthwise direction of the printed circuit board is required to be increased so as to absorb the difference in the number of bonding pads. Alternatively, when the light emitting element arrays are to be arranged at the center of the printed circuit board but the length in the widthwise direction of the printed circuit board is not desired to be increased, the following configuration is required. Wiring lines for the drive signals on the side on which a larger number of light emitting element arrays are arranged in the widthwise direction of the printed circuit board are required to be thinned and formed finer. Thus, there arises a problem in that an erroneous operation is caused by cross-talk between the wiring lines.

SUMMARY OF THE INVENTION

The present invention has been made in view of the above-mentioned circumstances, and has an object to suppress increase in size of a printed circuit board and wiring congestion on the printed circuit board even when an odd number of light emitting element arrays are arranged on the printed circuit board.

In order to solve the above-mentioned problem, according to an embodiment of the present invention, there is provided an image forming apparatus, comprising: a photosensitive member which is rotatable; and an exposure head including: a plurality of chips in each of which a plurality of light emitting elements configured to expose the photosensitive member are arrayed at intervals corresponding to a first resolution in an intersecting direction intersecting with a rotation direction of the photosensitive member; a printed circuit board on which the plurality of chips are mounted; a drive portion which is mounted on the printed circuit board, and is configured to drive the plurality of light emitting elements of each of the plurality of chips; and a wiring pattern which is printed on the printed circuit board, and is configured to connect the plurality of chips and the drive portion electrically, wherein the plurality of chips mounted on the printed circuit board is an odd number of chips, an even number of chips of the odd number of chips are arranged on one side of the printed circuit board in the rotation direction, and a remaining odd number of chips of the odd number of chips are arranged on another side of the printed circuit board in the rotation direction, and wherein a position of a center in the rotation direction of an intensity of a light amount of the plurality of light emitting elements of the plurality of chips is shifted to a side on which the even number of chips are arranged, with respect to a center of a position of the printed circuit board in the rotation direction.

Further features of the present invention will become apparent from the following description of exemplary embodiments with reference to the attached drawings.

BRIEF DESCRIPTION OF THE DRAWINGS

FIG. 10A is a detailed view of an ideal rectangular drive circuit board in which a light emitting center is offset in the embodiment.

FIG. 10B is a detailed view of a non-rectangular drive circuit board in which the light emitting center is offset in the embodiment.

FIG. 10C is a detailed view of a non-rectangular drive circuit board in which the light emitting center is offset in the embodiment.

FIG. 11 is a view for illustrating wiring of the surface emitting element array chips in the embodiment.

DESCRIPTION OF THE EMBODIMENTS

Figure 1:
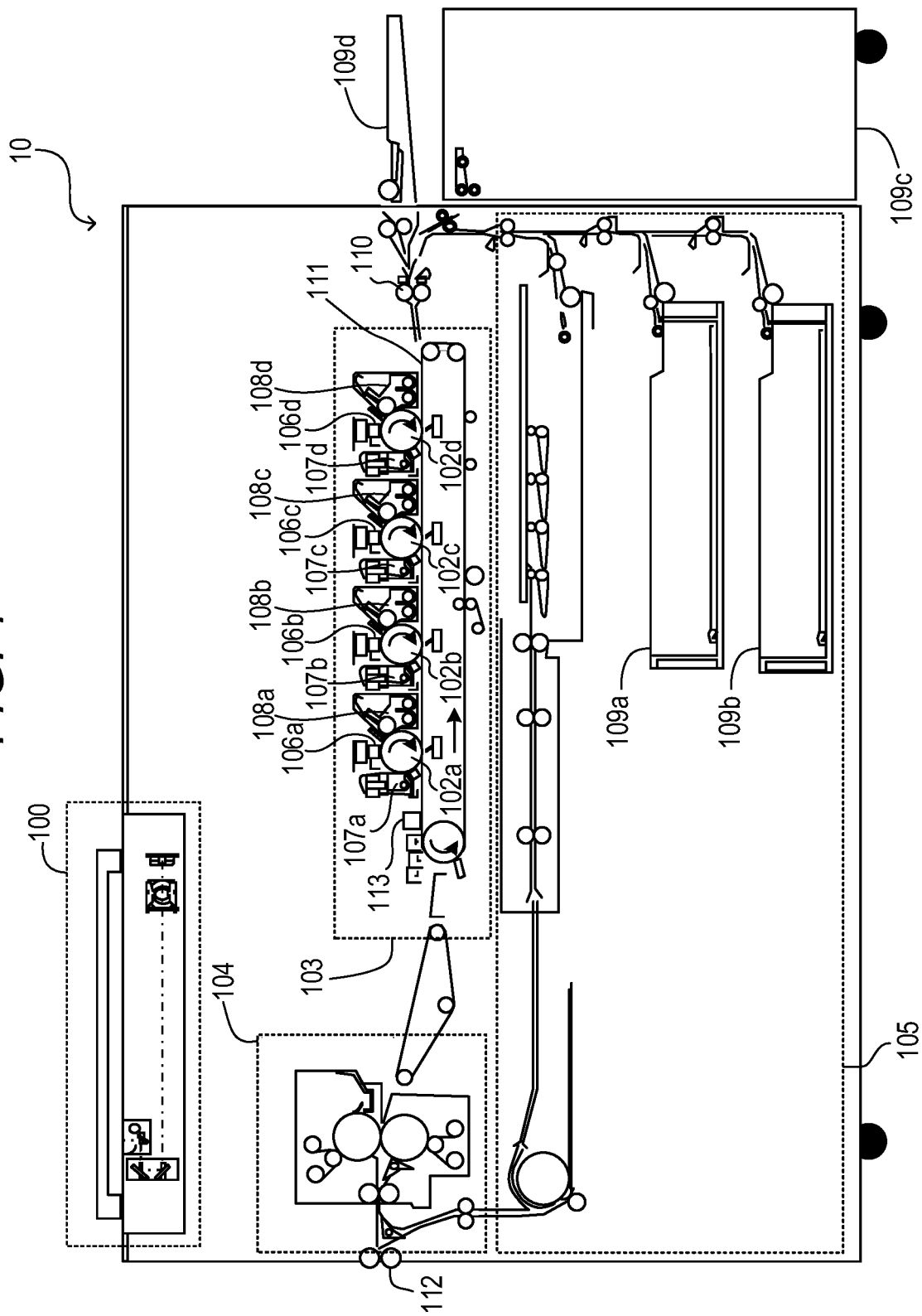
FIG. 1 is a schematic cross-sectional view for illustrating a configuration of an image forming apparatus according to an embodiment.

Referring to the drawings, an embodiment of the present invention is described below in detail.

[Configuration of Image Forming Apparatus]

FIG. 1 is a schematic cross-sectional view for illustrating a configuration of an electrophotographic image forming apparatus 10 according to an embodiment of the present invention. The image forming apparatus 10 illustrated in FIG. 1 is a multi-functional printer (MFP) having a scanning function and a printing function, and includes a scanner portion 100, an image forming portion 103, a fixing portion 104, a feeding/conveying portion 105, and a printer controller (not shown) configured to control those portions. The scanner portion 100 illuminates an original placed on an original table with light to optically read an original image, and converts the read image to an electrical signal to produce image data.

The image forming portion 103 includes a series of four image forming stations arranged in the color order of cyan (C), magenta (M), yellow (Y), and black (K) along a direction (counterclockwise direction) of rotation of an endless conveying belt 111. Each of the four image forming stations has the same configuration, and includes a photosensitive drum 102 serving as a photosensitive member configured to rotate in a direction of the arrow (clockwise direction), an exposure head 106, a charging device 107, and a developing device 108. Suffixes "a", "b", "c", and "d" following the reference numerals 102, 106, 107, and 108 of the photosensitive drum 102, the exposure head 106, the charging device 107, and the developing device 108 represent respective configurations corresponding to the black (K), the yellow (Y), the magenta (M), and the cyan (C) associated with the image forming stations. In the following, the suffixes of the reference numerals are omitted except when a specific photosensitive drum or the like is to be specified by the suffix.

In the image forming portion 103, the photosensitive drum 102 is rotated and charged by the charging device 107. The exposure head 106 serving as an exposure unit causes arranged LED arrays to emit light based on image data, and causes a rod lens array to focus emitted light from chip surfaces of the LED arrays onto the photosensitive drum 102 (onto the photosensitive member) to form an electrostatic latent image. The developing device 108 develops the electrostatic latent image formed on the photosensitive drum 102 with a toner. Then, the developed toner image is transferred onto recording paper on the conveying belt 111 configured to convey the recording paper. Such a sequential electrophotographic process is performed in each of the image forming stations. During image formation, after a lapse of a predetermined time period from the initiation of the image formation in the cyan (C) image forming station, respective image forming operations are performed in succession in the magenta (M), yellow (Y), and black (K) image forming stations.

The image forming apparatus 10 illustrated in FIG. 1 includes, as units configured to feed the recording paper, main-body feeding units 109a and 109b included in the feeding/conveying portion 105, an external feeding unit 109c, which is a large-capacity feeding unit, and a manual feeding unit 109d. During the image formation, the recording paper is fed from one of the feeding units that is specified in advance, and the fed recording paper is conveyed to registration rollers 110. The registration rollers 110 convey the recording paper onto the conveying belt 111 at a time when the toner images formed in the image forming portion 103 described above are transferred onto the recording paper. Onto the recording paper conveyed by the conveying belt 111, the toner images formed on the photosensitive drums 102 of the individual image forming stations are sequentially transferred. The recording paper on which the unfixed toner images are transferred is conveyed to the fixing portion 104. The fixing portion 104 has an internal heat source, for example, a halogen heater, and applies heat and pressure to the toner images on the recording paper with two rollers to fix the toner images onto the recording paper. The recording paper having the toner images fixed thereon by the fixing portion 104 is discharged by discharge rollers 112 to the outside of the image forming apparatus 10.

On a downstream side of the black (K) image forming station in a direction of conveyance of the recording paper, an optical sensor 113 serving as a sensing unit is disposed at a position facing the conveying belt 111. The optical sensor 113 detects a position of a test image formed on the conveying belt 111 to determine an amount of color shift between the toner images from the individual image forming stations. The amount of color shift determined by the optical sensor 113 is reported to a control substrate 415 (see FIG. 4) (described later), and the positions of the images in the individual colors are corrected to allow a full-color toner image free from color shift to be transferred onto the recording paper. The printer controller (not shown) performs an image forming operation based on an instruction from an MFP controller (not shown) configured to control the entire multi-functional printer (MFP), while controlling the above-mentioned scanner portion 100, image forming portion 103, fixing portion 104, feeding/conveying portion 105, and other portions.

As an example of the electrophotographic image forming apparatus, the image forming apparatus 10 of the type configured to transfer the toner images formed on the photosensitive drums 102 in the individual image forming stations directly onto the recording paper on the conveying belt 111 has been described above. However, the present invention is not limited to such a printer of the type configured to transfer the toner images on the photosensitive drums 102 directly onto the recording paper. The present invention is also applicable to an image forming apparatus including, for example, a primary transfer portion configured to transfer the toner images on the photosensitive drums 102 onto an intermediate transfer belt and a secondary transfer portion configured to transfer the toner images on the intermediate transfer belt onto the recording paper.

[Configuration of Exposure Head]

Figure 2A:
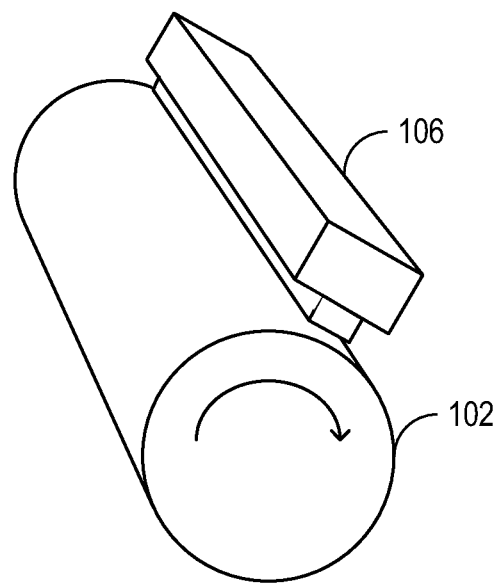
FIG. 2A is a view for illustrating a positional relationship between an exposure head and a photosensitive drum in the embodiment.
Figure 2B:
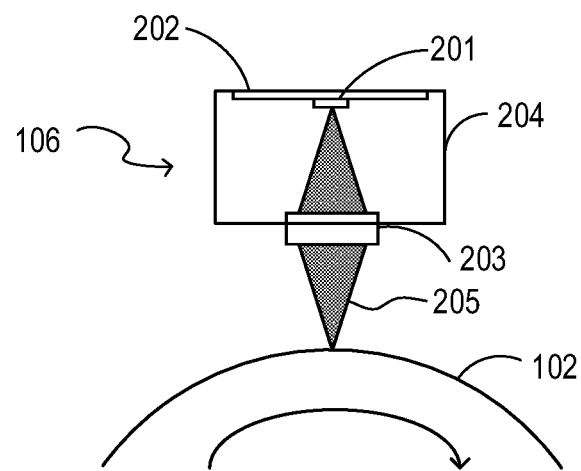
FIG. 2B is a view for illustrating a configuration of the exposure head.

Next, each of the exposure heads 106 configured to perform exposure on the corresponding photosensitive drum 102 is described with reference to FIG. 2A and FIG. 2B. FIG. 2A is a perspective view for illustrating a positional relationship between the exposure head 106 and the photosensitive drum 102. FIG. 2B is a view for illustrating an inner configuration of the exposure head 106 and focusing of a light flux 205 from the exposure head 106 by a rod lens array 203 onto the photosensitive drum 102. As illustrated in FIG. 2A, the exposure head 106 is mounted to the image forming apparatus 10 through use of a mounting member (not shown) to be located at a position above and facing the photosensitive drum 102 rotating in a direction of the arrow (FIG. 1).

As illustrated in FIG. 2B, the exposure head 106 includes a drive circuit board 202 being a printed circuit board, a surface emitting element array element group 201 mounted on the drive circuit board 202, the rod lens array 203, and a housing 204. To the housing 204, the rod lens array 203 and the drive circuit board 202 are mounted. The rod lens array 203 focuses the light flux 205 from the surface emitting element array element group 201 onto the photosensitive drum 102. In a factory, the exposure head 106 is solely subjected to assembly and adjustment work and, for each of spots, focus adjustment and light amount adjustment are performed. In this case, the assembly and adjustment are performed such that each of a distance between the photosensitive drum 102 and the rod lens array 203 and a distance between the rod lens array 203 and the surface emitting element array element group 201 is a predetermined interval. As a result, light from the surface emitting element array element group 201 is focused on the photosensitive drum 102. Accordingly, during the focus adjustment in the factory, a position at which the rod lens array 203 is mounted is adjusted such that the distance between the rod lens array 203 and the surface emitting element array element group 201 has a predetermined value. Further, during the light amount adjustment in the factory, the light emitting elements of the surface emitting element array element group 201 are sequentially caused to emit light, and drive currents of the light emitting elements are adjusted such that the light focused on the photosensitive drum 102 via the rod lens array 203 has a predetermined light amount.

[Configuration of Surface Emitting Element Array Element Group]

Figure 3A:
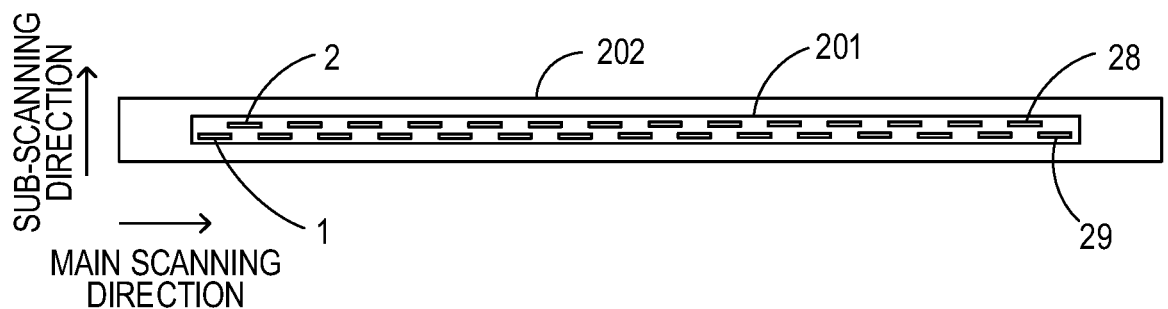
FIG. 3A is a schematic view for illustrating a surface of a drive circuit board in the embodiment on which a surface emitting element array element group is mounted.
Figure 3B:
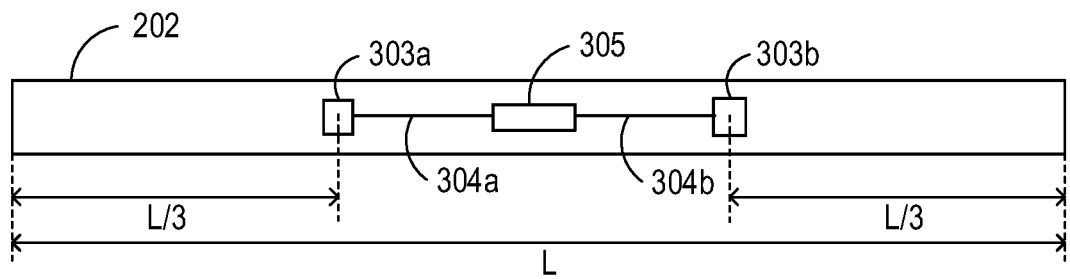
FIG. 3B is a schematic view for illustrating a surface of the drive circuit board opposite to the surface thereof on which the surface emitting element array element group is mounted.
Figure 3C:
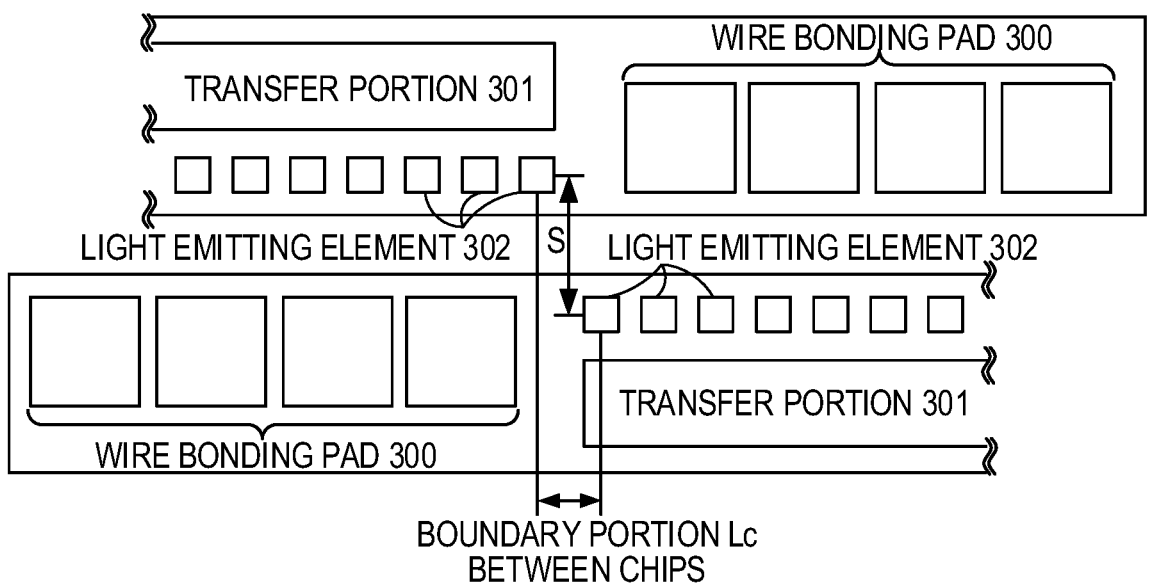
FIG. 3C is a view for illustrating a configuration of surface emitting element array chips.

FIG. 3A, FIG. 3B, and FIG. 3C are views for illustrating the surface emitting element array element group 201. FIG. 3A is a schematic diagram for illustrating a configuration of a surface of the drive circuit board 202 on which the surface emitting element array element group 201 is mounted. FIG. 3B is a schematic diagram for illustrating a configuration of a surface (second surface) of the drive circuit board 202 opposite to the surface (first surface) thereof on which the surface emitting element array element group 201 is mounted.

As illustrated in FIG. 3A, the surface emitting element array element group 201 mounted on the drive circuit board 202 has a configuration in which 29 surface emitting element array chips 1 to 29 are arranged in two rows in a staggered configuration along a longitudinal direction of the drive circuit board 202. In FIG. 3A, the vertical direction indicates a sub-scanning direction (direction of rotation of the photosensitive drum 102) being a first direction, and the horizontal direction indicates a main scanning direction being a second direction perpendicular to the sub-scanning direction. The main scanning direction is also an intersecting direction intersecting with the direction of rotation of the photosensitive drum 102. In each of the surface emitting element array chips, individual elements of the surface emitting element array chip having the total of 516 light emitting points are arranged with a predetermined resolution pitch in a longitudinal direction of the surface emitting element array chip. In the first embodiment, the pitch of the individual elements of the surface emitting element array chip is about 21.16 μm (≈2.54 cm/1,200 dots) corresponding to a pitch at a resolution of 1,200 dpi being a first resolution. As a result, a distance from end to end of the 516 light emitting points in one surface emitting element array chip is about 10.9 mm (≈21.16 μm×516). The surface emitting element array element group 201 includes the 29 surface emitting element array chips. The number of the light emitting elements that can be exposed in the surface emitting element array element group 201 is 14,964 (=516 elements×29 chips), which allows for image formation corresponding to an image width of about 316 mm (≈about 10.9 mm×29 chips) in the main scanning direction.

FIG. 3C is a diagram for illustrating an inter-chip boundary portion Lc between the surface emitting element array chips arranged in the two rows in the longitudinal direction. The horizontal direction in FIG. 3C corresponds to the longitudinal direction of the surface emitting element array element group 201 in FIG. 3A. As illustrated in FIG. 3C, on an end portion of each of the surface emitting element array chips, wire bonding pads 300, to which a control signal is to be input, are disposed. The signal input to the wire bonding pads 300 drives a transfer portion 301 and light emitting elements 302.

Each of the surface emitting element array chips includes the plurality of light emitting elements 302. In the boundary portion Lc between the surface emitting element array chips also, the pitch of the light emitting elements 302 in the longitudinal direction (distance between the respective center points of the two light emitting elements) is about 21.16 μm corresponding to a pitch at the resolution of 1,200 dpi. The light emitting element array chips arranged in the upper and lower two rows are disposed such that a distance (represented by an arrow S in FIG. 3C) between the respective light emitting points in the upper and lower surface emitting element array chips is about 84 jam (a distance corresponding to an integral multiple of a pitch at each resolution, which corresponds to four pixels at 1,200 dpi and to eight pixels at 2,400 dpi).

Further, as illustrated in FIG. 3B, on the surface of the drive circuit board 202 opposite to the surface thereof on which the surface emitting element array element group 201 is mounted, drive portions 303a and 303b and a connector 305 are mounted. The drive portions 303a and 303b are driver ICs. The drive portions 303a and 303b disposed on both sides of the connector 305 are configured to drive the surface emitting element array chips 1 to 15 and the surface emitting element array chips 16 to 29, respectively. The drive portions 303a and 303b are connected to the connector 305 via patterns 304a and 304b, respectively. On the drive circuit board 202, the patterns (wiring patterns) 304a and 304b for electrically connecting the plurality of surface emitting element array chips to the drive portions 303a and 303b are printed. A length in the longitudinal direction of the drive circuit board 202 is represented by L. The drive portion 303a is arranged at a position by a distance of about ⅓ (substantially one-third) of the length L in the longitudinal direction of the drive circuit board 202 from a left end in the longitudinal direction of the drive circuit board 202. The drive portion 303b is arranged at a position by a distance of about ⅓ of the length L in the longitudinal direction of the drive circuit board 202 from a right end in the longitudinal direction of the drive circuit board 202. The connector 305 is connected to signal lines for signals transmitted from the control circuit board 415 (see FIG. 4) (described later) to control the respective drive portions 303a and 303b, to a power supply, and to the ground, while being connected to the drive portions 303a and 303b. From the drive portions 303a and 303b, respective wires for electrically connecting those to drive the surface emitting element array element group 201 extend through an inner layer of the drive circuit board 202 to be connected to the surface emitting element array chips 1 to 15 and to the surface emitting element array chips 16 to 29.

[Control Configuration of Circuit Board and Exposure Head]

Figure 4:
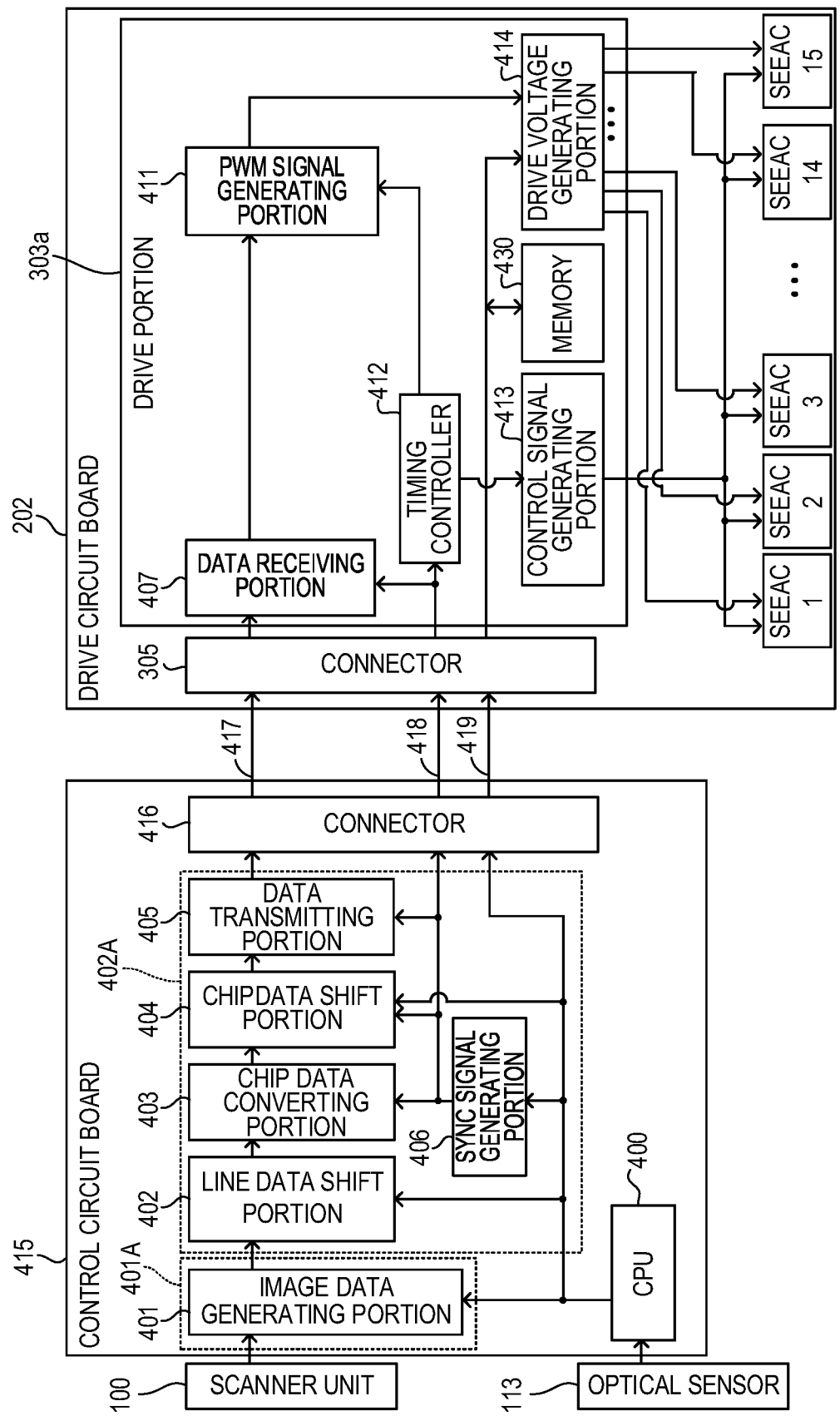
FIG. 4 is a control block diagram of a control circuit board and the exposure head in the embodiment.

FIG. 4 is a control block diagram of the control circuit board 415 configured to process the image data and output the image data to the exposure head 106, and the drive circuit board 202 configured to expose the photosensitive drum 102 based on the image data input from the control circuit board 415. Individual blocks 401 to 414 described below indicate modules in an IC. The drive circuit board 202 is described in association with the surface emitting element array chips 1 to 15 to be controlled by the drive portion 303a illustrated in FIG. 4. The surface emitting element array chips 16 to 29 to be controlled by the drive portion 303b (not shown in FIG. 4) also perform the same operations as those performed by the surface emitting element array chips ("SEEACs" in FIG. 4) 1 to 15 to be controlled by the drive portion 303a. Further, for simpler description, image processing for one color is described herein, but in the image forming apparatus 10 of this embodiment, the same processing is simultaneously performed for each of the four colors as parallel processing. The control circuit board 415 illustrated in FIG. 4 has a connector 416 for transmitting a signal for controlling the exposure head 106. From the connector 416, image data, a line sync signal (described later), and a control signal from a CPU 400 of the control circuit board 415 are transmitted via transmission cables 417, 418, and 419, which are connected to the connector 305 of the drive circuit board 202.

[Control Circuit Board]

The control circuit board 415 transmits a signal for controlling the exposure head 106 to the exposure head 106. This signal is a signal obtained by subjecting a clock signal, image data, and a line sync signal to parallel-serial conversion. The signals are input to the connector 305 on the exposure head side via the transmission cables 417, 418, and 419 for transmitting the signals from the connector 416 on the control circuit board 415 side. Further, a communication signal of the CPU 400 is input to the connector 305 on the exposure head 106 side via the transmission cable 419.

In the control circuit board 415, the CPU 400 performs processing of the image data and processing of printing timing. The control circuit board 415 includes functional blocks including an image data generating portion 401, a line data shift portion 402, a chip data converting portion 403, a chip data shift portion 404, a data transmitting portion 405, and a sync signal generating portion 406. In the following, processing in each of the functional blocks in the order is described in which the image data is processed in the control circuit board 415.

(Image Data Generating Portion)

The image data generating portion 401 serving as a data generating unit performs, on input image data received from the scanner portion 100 or from an external computer connected to the image forming apparatus 10, a dithering process at a resolution specified by the CPU 400 to generate the image data for print-out. In this embodiment, it is assumed that the image data generating portion 401 performs the dithering process at a resolution of 2,400 dpi equivalent to a second resolution. In other words, the image data generated by the image data generating portion 401 is pixel data equivalent to 2,400 dpi. The pixel data equivalent to 2,400 dpi in this embodiment is assumed to be one-bit data, but it is also possible to represent one pixel in a plurality of bits. The pixel data generated by the image data generating portion 401 is line data corresponding to a line equivalent to 2,400 dpi in the sub-scanning direction. The image data generating portion 401 is a single integrated circuit 401A.

(Line Data Shift Portion)

The CPU 400 determines respective amounts of image shift in the main scanning direction (longitudinal direction of the exposure head 106) and the sub-scanning direction (rotation direction of the photosensitive drum 102 and also direction of conveyance of the recording paper) in units of 2,400 dpi based on the amounts of color shift sensed by the optical sensor 113. The amounts of image shift are determined by the CPU 400 based on, for example, relative amounts of color shift from one color to another, which are calculated based on the result of the sensing of a color shift detection pattern image by the optical sensor 113. Then, the CPU 400 specifies an amount of image shift to the line data shift portion 402 as a correction unit. The line data shift portion 402 performs, on the entire image region in one page of the recording paper, a shifting process on the image data input from the image data generating portion 401 in units of 2,400 dpi based on the amount of image shift specified by the CPU 400. The line data shift portion 402 may also divide the image region in one page of the recording paper into a plurality of image regions and perform the shifting process on each of the plurality of image regions resulting from the division.

(Sync Signal Generating Portion)

The sync signal generating portion 406 serving as a second generating unit generates a cycle time signal (hereinafter referred to as "line sync signal"), which is synchronous with a rotating speed of the photosensitive drum 102 and corresponds to one line at the resolution of the output image in the direction of rotation of the photosensitive drum 102. The CPU 400 specifies, to the sync signal generating portion 406, the cycle time of the line sync signal, that is, a time period required by the surface of the photosensitive drum 102 to move by a pixel size (about 10.5 µm) at 2,400 dpi in the direction of rotation of the photosensitive drum 102 (in the sub-scanning direction) at the rotating speed of the photosensitive drum 102 determined in advance. For example, when printing is performed at a speed of 200 mm/second in the sub-scanning direction, the CPU 400 determines that the cycle time (cycle time corresponding to one line in the sub-scanning direction) of the line sync signal is about 52.9 µs ((25.4 mm/2,400 dots)/200 mm) and specifies the cycle time to the sync signal generating portion 406. When the image forming apparatus 10 has a sensing portion (for example, an encoder placed on a rotary shaft of the photosensitive drum) configured to sense the rotating speed of the photosensitive drum 102, the CPU 400 calculates the rotating speed of the photosensitive drum 102 in the sub-scanning direction based on a result of sensing (a generation cycle time of a signal output from the encoder) by the sensing portion. Then, the CPU 400 determines the cycle time of the line sync signal based on the result of the calculation. Meanwhile, when the image forming apparatus 10 does not have a sensing portion configured to sense the rotating speed of the photosensitive drum 102, the CPU 400 determines the cycle time of the line sync signal based on information on the type of paper such as a sheet basis weight (g/m$^2$) or a sheet size input by a user via an operating portion.

(Chip Data Converting Portion)

The chip data converting portion 403 reads out, in synchronization with the line sync signal, line data for each one line in the sub-scanning direction of the photosensitive drum 102 from the line data shift portion 402 on a line-by-line basis. Then, the chip data converting portion 403 performs data processing in which the read line data is divided into line data items corresponding to the individual chips.

Figure 5:
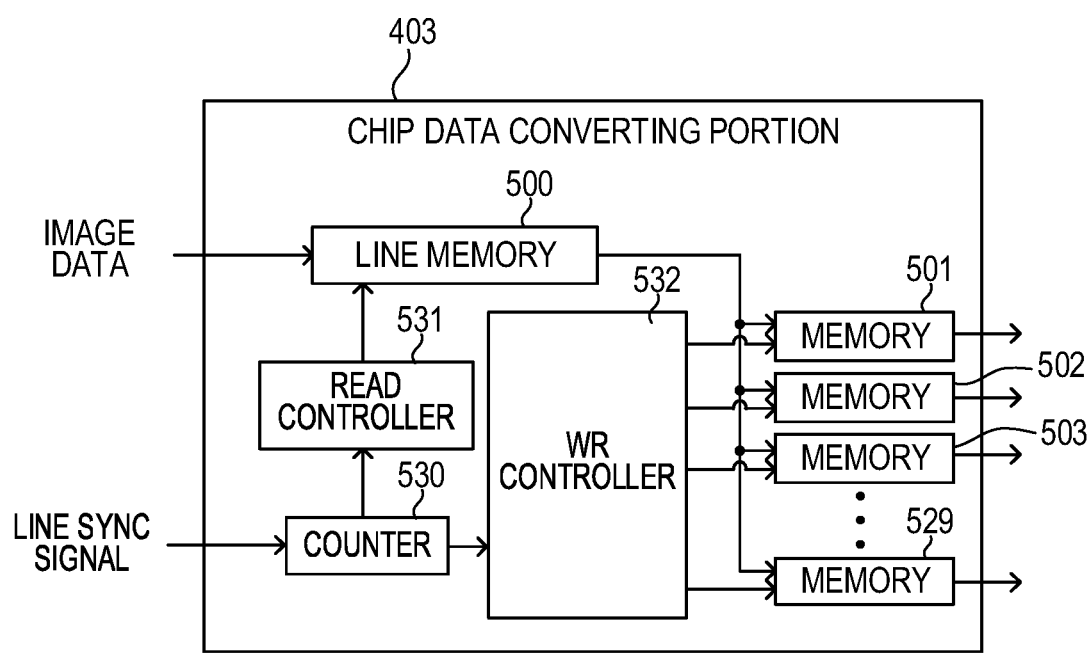
FIG. 5 is a control block diagram of a chip data converting portion in the embodiment.

FIG. 5 is a block diagram for illustrating a configuration of the chip data converting portion 403. In FIG. 5, the line sync signal output from the sync signal generating portion 406 is input to a counter 530. The counter 530 includes a frequency modulation circuit configured to modulate the input line sync signal to generate a CLK signal at a frequency higher than that of the line sync signal. The counter 530 may also include, instead of the frequency modulation circuit, an embedded oscillating device configured to generate a clock signal (CLK) at a frequency higher than that of the line sync signal. In the following, by way of example, description is given of a configuration in which the chip data converting portion 403 reads out the line data from the line data shift portion 402, but the embodiment is not limited thereto. Specifically, it is also possible to use a configuration in which the line sync signal is supplied to the line data shift portion 402, and the line data shift portion 402 generates a CLK signal therein and voluntarily transmits the line data to the chip data converting portion 403.

When the line sync signal is input to the counter 530, the counter 530 resets a count value to 0 and then increments the count value in synchronization with the pulse number of the CLK (clock) signal. The frequency of the CLK signal generated from the counter 530 is determined at a design stage based on a size (number of bits) of the pixel data to be read out by the chip data converting portion 403 in one cycle time of the line sync signal and on a data processing speed of the chip data converting portion 403 (described later). For example, as described above, the surface emitting element array element group 201 includes 14,964 light emitting elements (calculated at 1,200 dpi) configured to expose one line in the sub-scanning direction. Meanwhile, the image data generating portion 401 performs the dithering process at a resolution of 2,400 dpi. Accordingly, the number of pixels of the image data corresponding to one line in the sub-scanning direction output from the line data shift portion 402 is 29,928 (=14,964×(2,400 dpi/1,200 dpi)). The chip data converting portion 403 performs, between the line sync signals, the reading out of the image data corresponding to one line in the sub-scanning direction and the writing of the image data into a line memory 500 (described later), while performing the writing of the image data into memories 501 to 529 (described later). Accordingly, the counter 530 performs an operation of counting a number (29,928) corresponding to double the number (59,856) of pixels included in the line data corresponding to one line. It is assumed that a period during which the count value of the counter 530 is from 1 to 29,928 is represented by "Tm1", and a period during which the count value is from 29,929 to 59,856 is represented by "Tm2".

A read controller 531 reads the line data from the line data shift portion 402 based on the count value of the counter 530. Specifically, during the period Tm1, during which the count value of the counter 530 is from 1 to 29,928, the read controller 531 stores, in the line memory 500, the line data (29,928 pixels) corresponding to one line in the main scanning direction. During the period Tm2, during which the count value of the counter 530 is from 29,929 to 59,856, a WR controller 532 divides the line data corresponding to one line in the sub-scanning direction, which is stored in the line memory 500, and writes the divided line data into the memories 501 to 529. Each of the memories 501 to 529 has a storage capacity smaller than that of the line memory 500 and stores the line data divided for the individual chips (divided line data) on a per-chip basis. The memories 501 to 529 are first-in, first-out (FIFO) memories provided to correspond to the surface emitting element array chips (SEEACs) 1 to 29. Specifically, the memory 501 stores the line data corresponding to the surface emitting element array chip 1, the memory 502 stores the line data corresponding to the surface emitting element array chip 2, . . . , and the memory 529 stores the line data corresponding to the surface emitting element array chip 29.

In this embodiment, from the line memory 500, the line data items each corresponding to one line in the main scanning direction are sequentially read out, and the line data item is first written into the memory 501 for storing the line data item corresponding to the surface emitting element array chip 1. Then, the line data item is written into the memory 502 for storing the image data item corresponding to the surface emitting element array chip 2, and subsequently, the line data items are continuously written sequentially into the memories 503 to 529 for storing the image data items corresponding to the surface emitting element array chips 3 to 29. In the chip data shift portion 404 in a stage subsequent to that of the chip data converting portion 403, a data shifting process in the sub-scanning direction is performed individually for each of the surface emitting element array chips. Accordingly, it is assumed that, in the memories 501 to 529, the line data items corresponding to ten lines in the sub-scanning direction are stored.

Further, the line data item is stored in each of the memories 501 to 529 together with, in addition to the line data item for one chip corresponding to each of the surface emitting element array chips, pixel data items obtained by copying pixel data items at end portions of adjacent surface emitting element array chips. For example, the following pixel data item is stored in the memory 502. That is, the pixel data item at the outermost end portion of the surface emitting element array chip 1 on the surface emitting element array chip 2 side and the pixel data item at the outermost end portion of the surface emitting element array chip 3 on the surface emitting element array chip 2 side are respectively added to both ends of the line data item corresponding to the surface emitting element array chip 2, and the obtained data is stored in the memory 502.

(Chip Data Shift Portion)

The chip data shift portion 404 serving as a correction unit performs the following control. Specifically, based on data (in units of 2,400 dpi) related to an amount of image shift in the sub-scanning direction for each of the surface emitting element array chips, which is specified in advance by the CPU 400, relative timing to read out the line data item from each of the memories 501 to 529 is controlled. In the following, an image shifting process in the sub-scanning direction, which is performed by the chip data shift portion 404, is specifically described.

It is desired that, in the longitudinal direction of the exposure head, there be no shift of the position at which each of the even-numbered surface emitting element array chips is mounted. Likewise, it is also desired that, in the longitudinal direction of the exposure head, there be no shift of the position at which each of the odd-numbered surface emitting element array chips is mounted. It is also preferred in terms of design that, in the sub-scanning direction, a distance between the position at which each of the even-numbered surface emitting element array chips is mounted and the position at which each of the odd-numbered surface emitting element array chips is mounted corresponds to a predetermined number of pixels (for example, eight pixels) at 2,400 dpi. It is also preferred that a position at which a row of the light emitting elements is disposed in the sub-scanning direction be not allowed to vary from one surface emitting element array chip to another and be fixed in each of the surface emitting element array chips. However, the positions at which the surface emitting element array chips are mounted and the position at which the row of the light emitting elements is disposed include errors, and such errors may possibly degrade the image quality of an output image.

A memory 430 (ROM) illustrated in FIG. 4 stores therein correction data calculated from a relative positional relationship between the individual rows of the light emitting elements in the sub-scanning direction in the surface emitting element array chips 1 to 15, which are mounted in the staggered configuration on the drive circuit board 202. For example, the memory 430 stores therein the correction data based on measurement data, which indicates the number of pixels at 2,400 dpi by which each of the rows of the light emitting elements mounted on the drive circuit board 202 in the surface emitting element array chips 2 to 15 other than the surface emitting element array chip 1 is shifted in the sub-scanning direction from the row of the light emitting elements in the surface emitting element array chip 1 serving as a basis for a position in the sub-scanning direction. The measurement data is obtained as follows. After the surface emitting element array chips 2 to 15 are mounted on the drive circuit board 202, a measurement device turns ON the light emitting elements in each of the surface emitting element array chips and performs measurement based on the result of receiving light. The CPU 400 sets, in an internal register of the chip data shift portion 404, the correction data read out from the memory 430 in response to the turning ON of a power supply of the image forming apparatus 10. The chip data shift portion 404 performs a shifting process on the line data items each for forming the same line stored in the memories 501 to 529 based on the correction data set in the internal register. For example, when the row of the light emitting elements in the surface emitting element array chip 2 is shifted by eight pixels at 2,400 dpi from the row of the light emitting elements in the surface emitting element array chip 1 in the sub-scanning direction, the chip data shift portion 404 shifts all the line data items corresponding to the surface emitting element array chip 2 from the line data items corresponding to the surface emitting element array chip 1 so as to delay, from a time when each of the line data items corresponding to the surface emitting element array chip 1 is output to the drive circuit board 202, a time when each of the line data items corresponding to the surface emitting element array chip 2, which is for forming the same line, is output to the drive circuit board 202 by eight pixels.

(Data Transmitting Portion)

The data transmitting portion 405 transmits, to the drive circuit board 202 of the exposure head 106, the line data items obtained after data processing is performed on the series of line data items described above. As illustrated in FIG. 3A, of the surface emitting element array chips, the odd-numbered surface emitting element array chips 1, 3, 5, . . . , 29 are disposed on an upstream side in the sub-scanning direction, and the even-numbered surface emitting element array chips 2, 4, 6, . . . , 28 are disposed on a downstream side in the sub-scanning direction. Writing of the image data items into the memories 501 and 529 corresponding to the odd-numbered surface emitting element array chips 1 and 29 is performed during the period of the first line sync signal. Then, during the subsequent period of the line sync signal, data items corresponding to the first line in the sub-scanning direction are read out from the memories 501 and 529 corresponding to the odd-numbered surface emitting element array chips 1 and 29. Likewise, during the period of the subsequent line sync signal, data items corresponding to the second line in the sub-scanning direction are read out from the memories 501 and 529 corresponding to the odd-numbered surface emitting element array chips 1 and 29. Then, during the period of the tenth line sync signal, from the memories 501 and 529 corresponding to the odd-numbered surface emitting element array chips 1 and 29, data items corresponding to the ninth line in the sub-scanning direction are read out. From the memory 502 corresponding to the even-numbered surface emitting element array chip 2, the image data item is read out from the memory 502 during the period subsequent to the period TL1, during which the image data item is written into the memory 502, by nine pulses of the line sync signal.

The data transmitting portion 405 transmits the line data items processed by the chip data shift portion 404 to the drive circuit board 202. The counter 530 includes, instead of an oscillating device, a frequency modulation circuit configured to modulate the line sync signal input thereto to generate a CLK signal at a frequency higher than that of the line sync signal. The counter 530 may also include, instead of the frequency modulation circuit, an embedded oscillating device configured to generate a clock (CLK) signal at a frequency higher than that of the line sync signal. In this embodiment, the frequency of the clock signal is determined such that the count value is equal to or larger than 59,856 (number that is double the number of pixel data items corresponding to one line) in one cycle time of the line sync signal. This allows the inputting (writing) of the image data to the line memory 500 and the outputting (writing) of the image data from the line memory 500 to the memories 501 to 529 to be performed in one cycle time of the line sync signal.

Meanwhile, data is read out from the memories 501 to 529 such that, from the 29 memories 501 to 529, the image data items each corresponding to one line in the main scanning direction and corresponding to the individual surface emitting element array chips are output in parallel in one cycle time of the line sync signal. Accordingly, the image data items may also be read out from the memories 501 to 529 at a speed lower than a speed at which the image data items are written into the memories. For example, in this embodiment, it is assumed that the image data items are read out from the memories 501 to 529 in a cycle time that is 58 times longer than the number of pulses at the time when the image data items are written into the memories 501 to 529.

The line data shift portion 402, the chip data converting portion 403, the chip data shift portion 404, the data transmitting portion 405, and the sync signal generating portion 406 form an integrated circuit 402A different from the integrated circuit 401A. Further, the CPU 400 is an integrated circuit different from the integrated circuit 401A and the integrated circuit 402A.

[Drive Portion of Exposure Head]
(Data Receiving Portion)

Next, a process to be performed inside the drive portion 303a of the drive circuit board 202 is described. A data receiving portion 407 receives data transmitted from the data transmitting portion 405 of the control circuit board 415 to separate the clock signal, the line sync signal, and the image data from one another. The data receiving portion 407 and the data transmitting portion 405 may use generally-known parallel-serial conversion. In this embodiment, the clock signal, the line sync signal, and the image data are transmitted to the drive portion 303a through parallel-serial conversion, but may be transmitted thereto in parallel. Further, the drive portion 303a operates based on the clock signal received by the data receiving portion 407. The reason therefor is because a clock oscillating device or a crystal oscillator can be omitted in the drive portion 303a.

It is assumed herein that the data receiving portion 407 and the data transmitting portion 405 receive and transmit the image data on a per-line basis in the sub-scanning direction in synchronization with the line sync signal. As described above, in the chip data converting portion 403, the data items are arranged for the individual surface emitting element array chips 1 to 29, and the subsequent processing blocks are configured to process the data items for the surface emitting element array chips 1 to 29 in parallel. It is assumed that the drive portion 303a includes a circuit being configured to receive the image data items corresponding to the individual surface emitting element array chips 1 to 15 and being capable of processing the image data items in parallel for the individual surface emitting element array chips.

(PWM Signal Generating Portion, Timing Controller, Control Signal Generating Portion, and Drive Voltage Generating Portion)

Subsequently, the PWM signal generating portion 411 generates a pulse width signal (hereinafter referred to as "PWM signal") corresponding to the light emission time during which each of the surface emitting element array chips emits light in one pixel interval based on the data value for each of the pixels. The timing to output the PWM signal is controlled by the timing controller 412. The timing controller 412 generates a sync signal corresponding to the pixel interval of each of the pixels from the line sync signal generated from the sync signal generating portion 406 of the control circuit board 415 and outputs the sync signal to the PWM signal generating portion 411. The drive voltage generating portion 414 generates a drive voltage for driving each of the surface emitting element array chips in synchronization with the PWM signal. The drive voltage generating portion 414 has a configuration that allows the CPU 400 to adjust a voltage level of the output signal to around 5 V so as to achieve a predetermined light amount. In this embodiment, each of the surface emitting element array chips is configured to be able to simultaneously and independently drive the four light emitting elements. The drive voltage generating portion 414 supplies drive signals to four lines for each of the surface emitting element array chips, specifically, supplies the drive signals to 1 line (15 chips)×4=60 lines in the staggered configuration in the entire exposure head 106. It is assumed that the respective drive signals supplied to the individual surface emitting element array chips are represented by $\Phi W1$ to $\Phi W4$ (see FIG. 6). Meanwhile, through an operation of a shift thyristor (see FIG. 6), the individual surface emitting element array chips are sequentially driven. The control signal generating portion 413 generates, from the sync signal corresponding to the pixel interval, which is generated from the timing controller 412, control signals $\Phi s$, $\Phi 1$, and $\Phi 2$ for transferring a shift thyristor for each of the pixels (see FIG. 6).

[Description of SLED Circuit]

Figure 6:
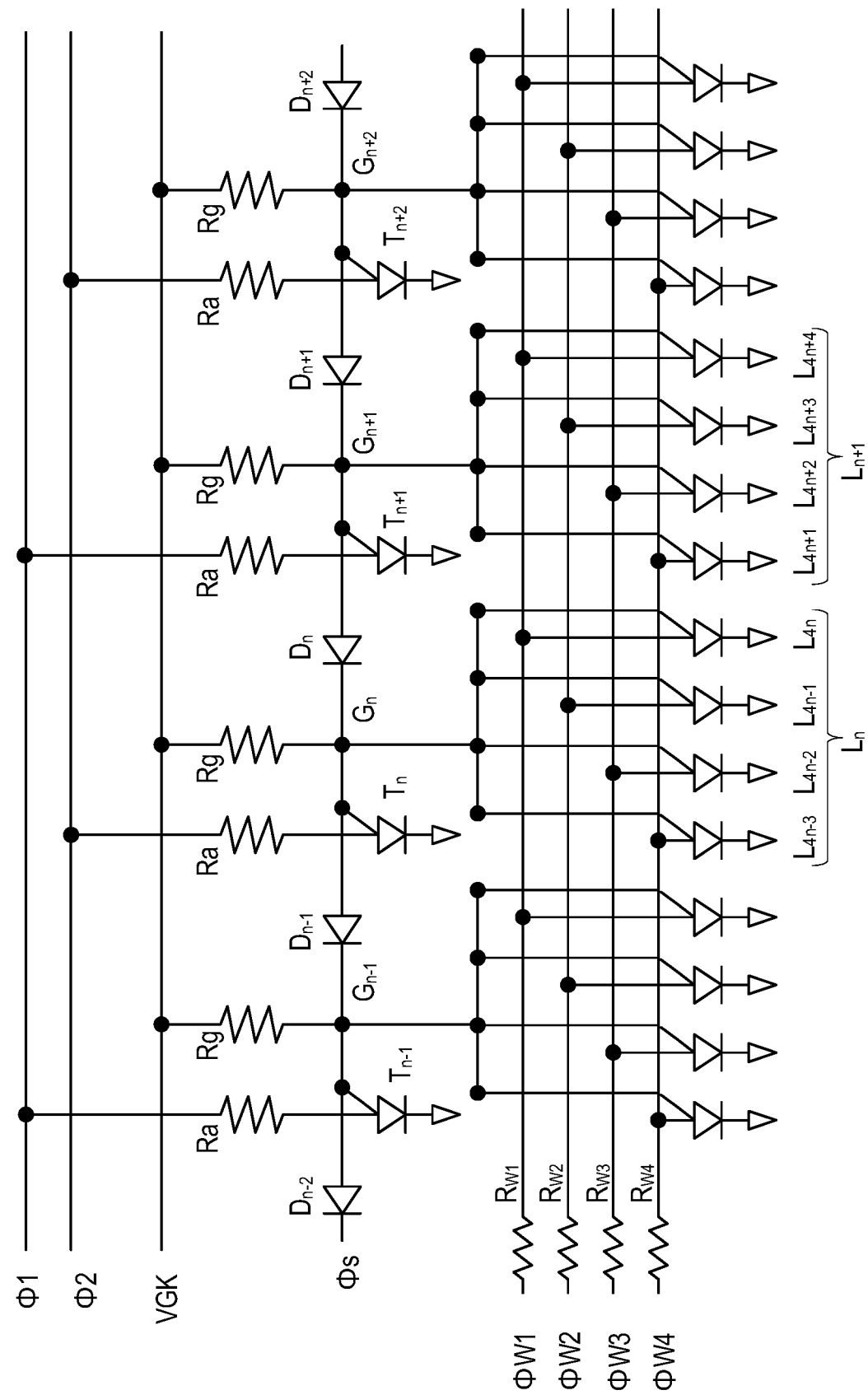
FIG. 6 is a diagram for illustrating a circuit of the surface emitting element array chip in the embodiment.

FIG. 6 is an illustration of an equivalent circuit of an extracted part of a self-scanning light emitting element (self-scanning LED: SLED) array chip in this embodiment. In FIG. 6, Ra and Rg indicate an anode resistor and a gate resistor, respectively, and Tn indicates a shift thyristor. Dn indicates a transfer diode, and Ln indicates a light emitting thyristor. Further, Gn indicates a common gate of a corresponding shift thyristor Tn and a light emitting thyristor Ln connected to the shift thyristor Tn. In this case, "n" is an integer of 2 or more. Φ1 indicates a transfer line for odd-numbered shift thyristors T, and Φ2 indicates a transfer line for even-numbered shift thyristors T. ΦW1 to ΦW4 indicate lighting signal lines for the light emitting thyristors L, and are connected to resistors RW1 to RW4, respectively. VGK indicates a gate line, and Φs indicates a start pulse line. As illustrated in FIG. 6, four light emitting thyristors of from L4$n$−3 to L4$n$ are connected to one shift thyristor Tn, and the four light emitting thyristors L4$n$−3 to L4$n$ can be simultaneously turned on.

[Operation of SLED Circuit]

Next, the operation of the SLED circuit illustrated in FIG. 6 is described. In the circuit diagram of FIG. 6, it is assumed that a voltage of 5 V is applied to the gate line VGK, and voltages input to the transfer lines Φ1 and Φ2 and the lighting signal lines ΦW1 to ΦW4 are also 5 V. In FIG. 6, when the shift thyristor Tn is in an ON state, the potential of the common gate Gn of the shift thyristor Tn and the light emitting thyristor Ln connected to the shift thyristor Tn is reduced to about 0.2 V. The common gate Gn of the light emitting thyristor Ln and the common gate Gn+1 of the light emitting thyristor Ln+1 are connected to each other by a coupling diode Dn, and hence a potential difference substantially equal to a diffusion potential of the coupling diode Dn is generated. In this embodiment, the diffusion potential of the coupling diode Dn is about 1.5 V, and hence the potential of the common gate Gn+1 of the light emitting thyristor Ln+1 is 1.7 V (=0.2 V+1.5 V) which is the sum of the diffusion potential of 1.5 V and the potential of the common gate Gn of the light emitting thyristor Ln of 0.2 V. Likewise, the potential of the common gate Gn+2 of the light emitting thyristor Ln+2 is 3.2 V (=1.7 V+1.5 V), and the potential of the common gate Gn+3 (not shown) of the light emitting thyristor Ln+3 (not shown) is 4.7 V (=3.2 V+1.5 V). The potential is 5 V in the common gate Gn+4 of the light emitting thyristor Ln+4 and the subsequent common gates because the voltage of the gate line VGK is 5 V, and thus the potential cannot be higher than 5 V. Further, the potential of the common gate Gn−1 prior to the common gate Gn of the light emitting thyristor Ln (left side of the common gate Gn of FIG. 6) is 5 V because the coupling diode Dn−1 is in a reverse bias state, and thus the voltage of the gate line VGK is applied without drop.

Figure 7A:
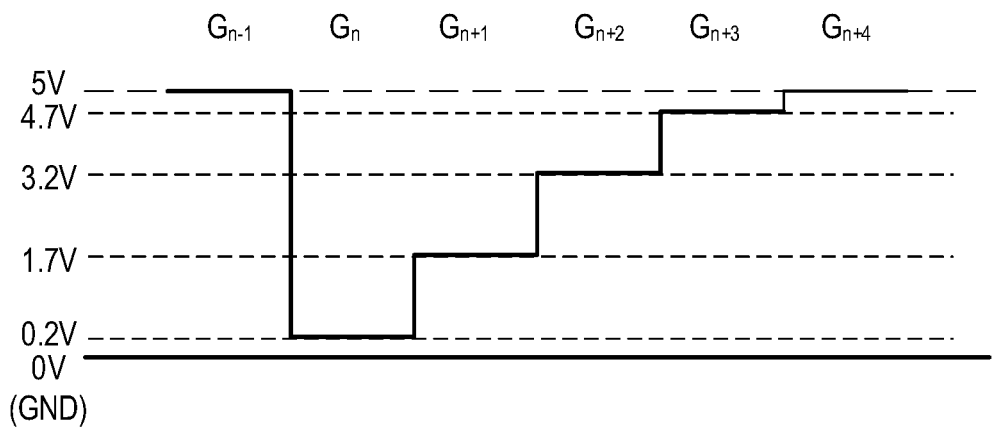
FIG. 7A is a graph for showing a distribution state of a gate potential of a shift thyristor in the embodiment.

FIG. 7A is a graph for showing a distribution of a gate potential of the common gate Gn of each of the light emitting thyristors Ln when the above-mentioned shift thyristor Tn is in the ON state. Common gates Gn−1, Gn, Gn+1 . . . indicate common gates of the light emitting thyristors L of FIG. 6. Further, the vertical axis of FIG. 7A represents a gate potential. A voltage required for turning on each of the shift thyristors Tn (hereinafter referred to as "threshold value voltage") has substantially the same potential as that obtained by adding the diffusion potential (1.5 V) to the gate potential of the common gate Gn of each of the light emitting thyristors Ln. When the shift thyristor Tn is in the ON state, among the shift thyristors connected to the same transfer line Φ2 as that of the shift thyristor Tn, the shift thyristor Tn+2 has the lowest common gate potential. As described above, the potential of the common gate Gn+2 of the light emitting thyristor Ln+2 connected to the shift thyristor Tn+2 is 3.2 V (=1.7 V+1.5 V) (FIG. 7A). Thus, the threshold value voltage of the shift thyristor Tn+2 is 4.7 V (=3.2 V+1.5 V). However, the shift thyristor Tn is in the ON state, and hence the potential of the transfer line Φ2 is drawn to about 1.5 V (diffusion potential), and thus becomes lower than the threshold value voltage of the shift thyristor Tn+2. Thus, the shift thyristor Tn+2 cannot be turned on. Other shift thyristors connected to the same transfer line Φ2 have higher threshold value voltages than that of the shift thyristor Tn+2, and hence cannot be turned on as well. Only the shift thyristor Tn can be maintained in the ON state.

Figure 7B:
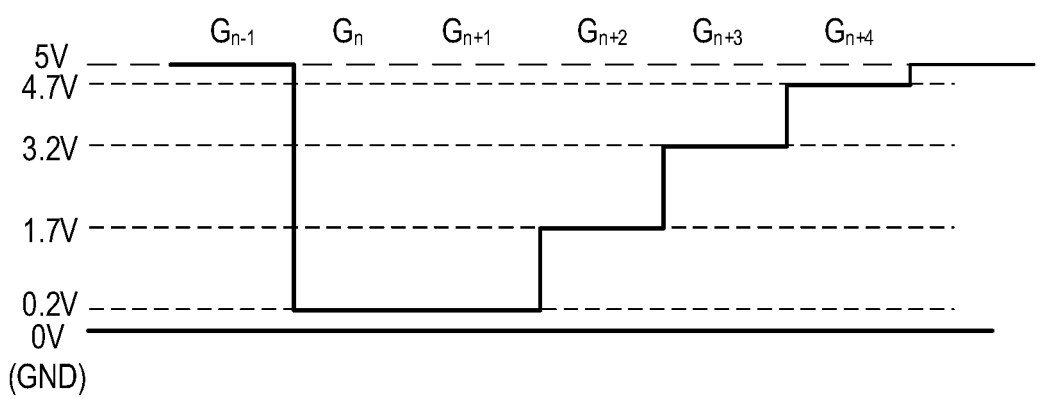
FIG. 7B is a graph for showing a distribution state of the gate potential of the shift thyristor in the embodiment.
Figure 7C:
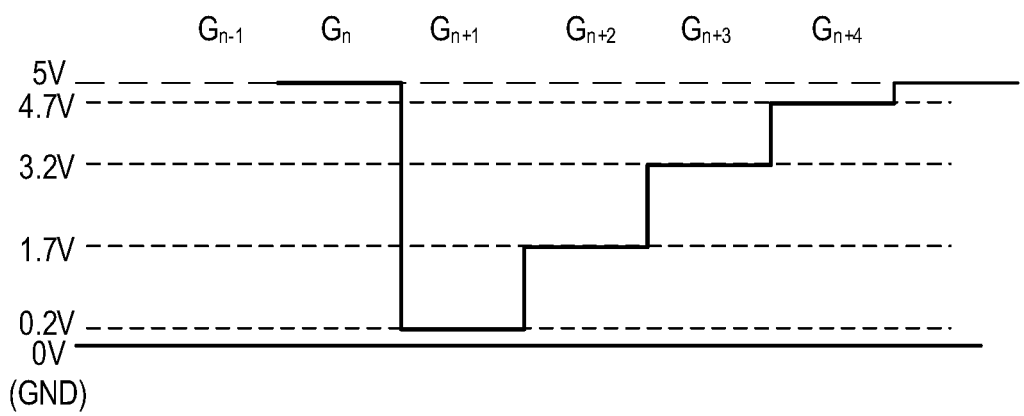
FIG. 7C is a graph for showing a distribution state of the gate potential of the shift thyristor in the embodiment.

Further, with regard to the shift thyristors connected to the transfer line Φ1, the threshold value voltage of the shift thyristor Tn+1 having the lowest threshold value voltage is 3.2 V (=1.7 V+1.5 V). Further, the threshold value voltage of the shift thyristor Tn+3 having the second lowest threshold value voltage (not shown in FIG. 6) is 6.2 V (=4.7 V+1.5 V). When a voltage of 5 V is input to the transfer line Φ1 under this state, only the shift thyristor Tn+1 can transition to the ON state. This state corresponds to a state in which the shift thyristor Tn and the shift thyristor Tn+1 are simultaneously in the ON state. Accordingly, the gate potentials of the shift thyristors Tn+2, Tn+3, and the like provided on the right side of the shift thyristor Tn+1 in the circuit diagram of FIG. 6 are each reduced by the amount of the diffusion potential (1.5 V). However, the voltage of the gate line VGK is 5 V, and the voltage of the common gate of the light emitting thyristor L is limited by the voltage of the gate line VGK, and hence the gate potentials of the shift thyristors on the right side of the shift thyristor Tn+5 are 5 V. FIG. 7B is a graph for showing a gate voltage distribution of the common gates Gn−1 to Gn+4 at this time, and the vertical axis represents a gate potential. When the potential of the transfer line Φ2 is decreased to 0 V under this state, the shift thyristor Tn is turned off, and the potential of the common gate Gn of the shift thyristor Tn is increased to the VGK potential. FIG. 7C is a graph for showing a gate voltage distribution at this time, and the vertical axis represents a gate potential. In this manner, the transfer of the ON state from the shift thyristor Tn to the shift thyristor Tn+1 is completed.

[Light Emitting Operation of Light Emitting Thyristor]

Next, a light emitting operation of the light emitting thyristor is described. When only the shift thyristor Tn is turned on, the gates of the four light emitting thyristors of from L4$n$−3 to L4$n$ are connected in common to the common gate Gn of the shift thyristor Tn. Accordingly, the gate potentials of the light emitting thyristors L4$n$−3 to L4$n$ are equal to that of the common gate Gn, that is, 0.2 V. Thus, the threshold value of each of the light emitting thyristors is 1.7 V (=0.2 V+1.5 V), and the light emitting thyristors L4$n$−3 to L4$n$ can be turned on when a voltage of 1.7 V or more is input thereto from the lighting signal lines ΦW1 to ΦW4 for the light emitting thyristors. Thus, when the shift thyristor Tn is turned on, lighting signals are input to the lighting signal lines ΦW1 to Φ4 so that the four light emitting thyristors L4$n$−3 to L4$n$ in any combination can be selectively caused to emit light. At this time, the potential of the common gate Gn+1 of the shift thyristor Tn+1 adjacent to the shift thyristor Tn is 1.7 V, and the threshold value voltages of the light emitting thyristors L4$n$+1 to L4$n$+4 gate-connected to the common gate Gn+1 are 3.2 V (=1.7 V+1.5 V). The lighting signals input from the lighting signal lines ΦW1 to ΦW4 are 5 V, and hence also the light emitting thyristors L4n+1 to L4n+4 seem to be turned on by the same lighting pattern as the lighting pattern of the light emitting thyristors L4n−3 to L4n. However, the light emitting thyristors L4n−3 to L4n have lower threshold value voltages, and are thus turned on earlier than the light emitting thyristors L4n+1 to L4n+4 when the lighting signals are input from the lighting signal lines ΦW1 to ΦW4. Once the light emitting thyristors L4n−3 to L4n are turned on, the connected lighting signal lines ΦW1 to ΦW4 are drawn to about 1.5 V (diffusion potential). Accordingly, the potentials of the lighting signal lines ΦW1 to ΦW4 become lower than the threshold value voltages of the light emitting thyristors L4n+1 to L4n+4, and hence the light emitting thyristors L4n+1 to L4n+4 cannot be turned on. As described above, when a plurality of light emitting thyristors L are connected to one shift thyristor T, the plurality of light emitting thyristors L can be simultaneously turned on.

Figure 8:
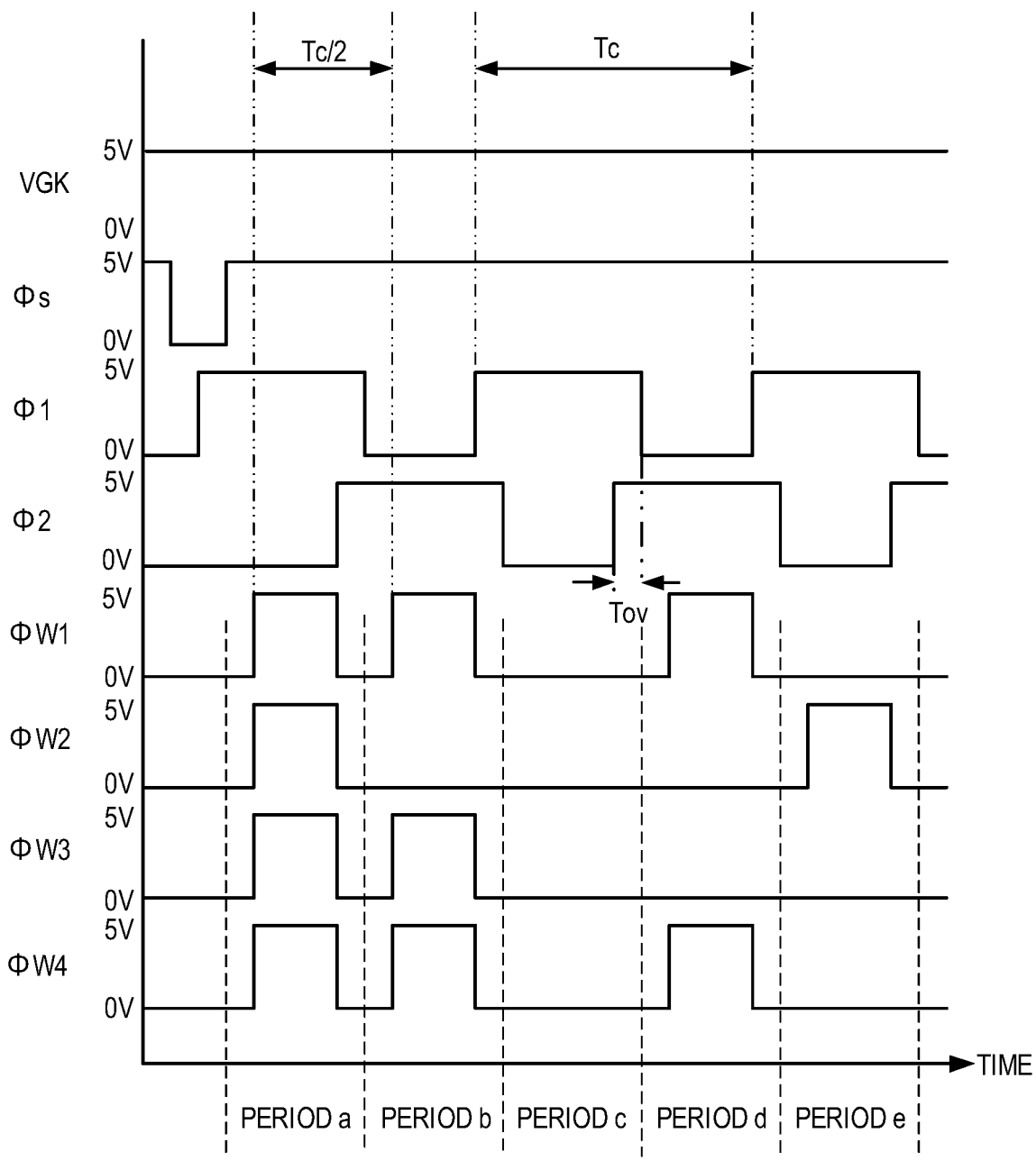
FIG. 8 is a graph for showing drive signal waveforms of the surface emitting element array chip in the embodiment.

FIG. 8 is a timing chart of drive signals for the SLED circuit illustrated in FIG. 6. FIG. 8 shows, in order from the top, voltage waveforms of the drive signals of the gate line VGK, the start pulse line Φs, the transfer lines Φ1 and Φ2 for the odd-numbered and even-numbered shift thyristors, and the lighting signal lines ΦW1 to ΦW4 for the light emitting thyristors. Each of the drive signals has a voltage of 5 V in the ON state, and a voltage of 0 V in the OFF state. Further, the horizontal axis of FIG. 8 represents time. Further, Tc indicates a cycle time of the clock signal Φ1, and Tc/2 indicates a cycle time corresponding to half (=½) of the cycle time Tc.

The gate line VGK is always supplied with a voltage of 5 V. Further, the clock signal Φ1 for the odd-numbered shift thyristors and the clock signal Φ2 for the even-numbered shift thyristors are input at the same cycle time Tc, and the start pulse line supplies the signal Φs of 5 V. Slightly before the clock signal Φ1 for the odd-numbered shift thyristors first becomes 5 V, the signal Φs of the start pulse line is dropped to 0 V in order to provide a potential difference to the gate line VGK. In this manner, the gate potential of the first shift thyristor Tn−1 is drawn from 5 V to 1.7 V, and the threshold value voltage becomes 3.2 V so that the shift thyristor Tn−1 can be turned on by the signal from the transfer line Φ1. Slightly after a voltage of 5 V is applied to the transfer line Φ1 and the first shift thyristor Tn−1 transitions to the ON state, a voltage of 5 V is supplied to the start pulse line Φs. A voltage of 5 V is thereafter continuously supplied to the start pulse line Φs.

The transfer line Φ1 and the transfer line Φ2 are configured to have a time period Tov of the overlapped ON state (in this case, 5 V) and have a substantially complementary relationship. A signal is transmitted to each of the lighting signal lines ΦW1 to ΦW4 for turning on the light emitting thyristor at a cycle time that is half of the cycle time of the transfer lines Φ1 and Φ2, and the light emitting thyristor is turned on when a voltage of 5 V is applied when the corresponding shift thyristor is in the ON state. For example, in a period "a", all of the four light emitting thyristors connected to the same shift thyristor are in the ON state, and in a period "b", three light emitting thyristors are simultaneously in the ON state. Further, in a period "c", all of the light emitting thyristor are in the OFF state, and in a period "d", two light emitting thyristors are simultaneously in the ON state. In a period "e", only one light emitting thyristor is in the ON state.

In this embodiment, the number of light emitting thyristors connected to one shift thyristor is 4, but the present invention is not limited thereto. The number may be smaller or larger than 4 depending on applications. The circuit described above is a circuit having a common cathode for the thyristors, but even a circuit having a common anode is applicable by inverting the polarities as appropriate.

[Structure of Surface Emitting Thyristor]

Figure 9A:
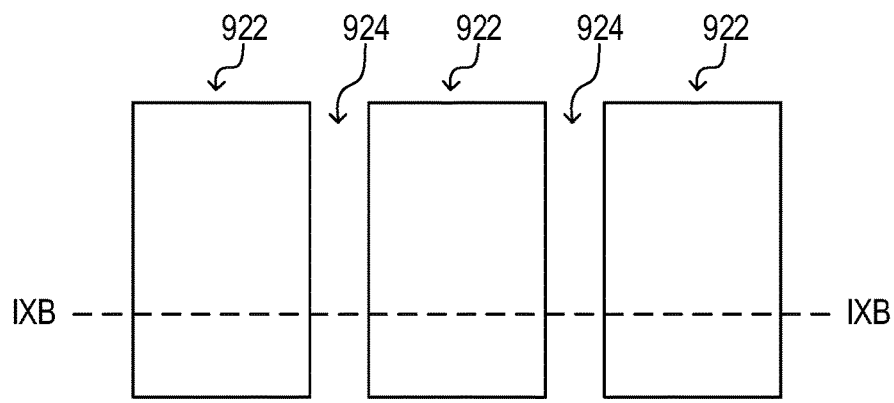
FIG. 9A is a plan view of a plurality of light emitting elements having mesa structures in the embodiment.
Figure 9B:
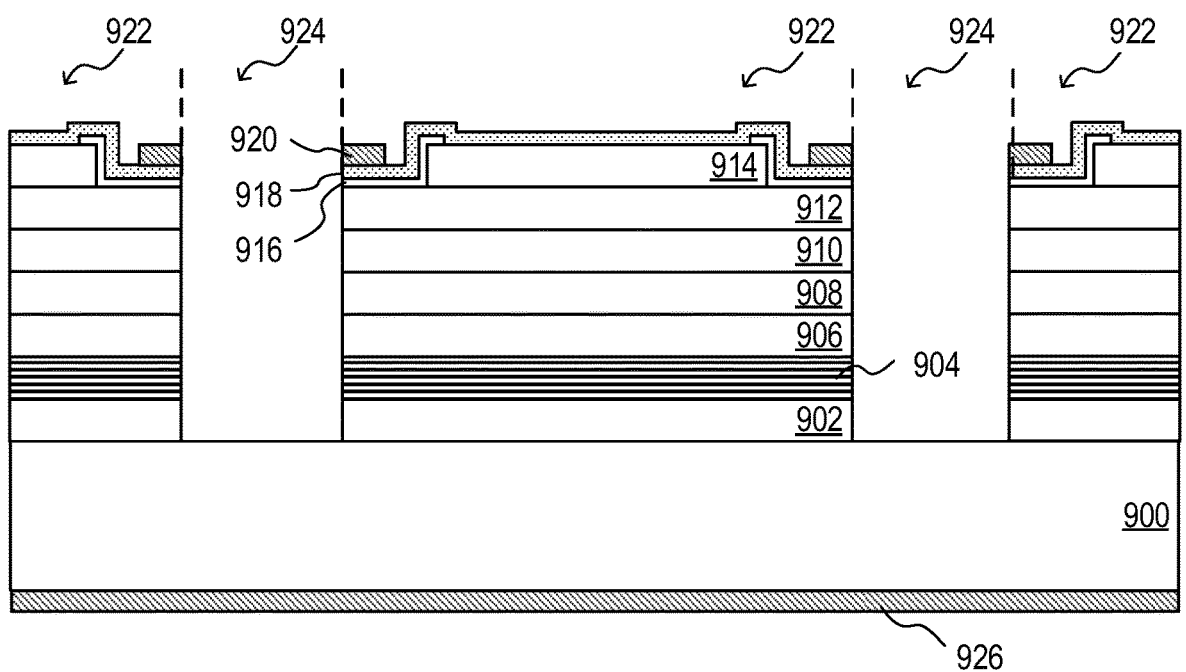
FIG. 9B is a cross-sectional view of the light emitting elements having the mesa structures, taken along the line IXB-IXB of FIG. 9A.

FIG. 9A and FIG. 9B are schematic views for illustrating a surface emitting thyristor portion in this embodiment. FIG. 9A is a plan view (schematic view) for illustrating a light emitting element array in which a plurality of light emitting elements formed into mesa (trapezoid) structures 922 are arrayed. FIG. 9B is a schematic cross-sectional view of the light emitting elements formed into the mesa structures 922, taken along the line IXB-IXB of FIG. 9A. The mesa structures 922 into which the light emitting elements are formed are arranged at predetermined pitches (intervals between the light emitting elements) (for example, about 21.16 μm in the case of a resolution of 1,200 dpi), and the mesa structures 922 are separated apart from each other by element isolation grooves 924.

FIG. 9B shows a first-conductivity-type compound semiconductor substrate 900, a first-conductivity-type buffer layer 902 having the same conductivity type as that of the substrate 900, and a first-conductivity-type distribution Bragg reflection (DBR) layer 904 formed by laminating two types of semiconductor layers. FIG. 9B further shows a first first-conductivity-type semiconductor layer 906, a first second-conductivity-type semiconductor layer 908 having a conductivity type different from the first conductivity type, a second first-conductivity-type semiconductor layer 910, and a second second-conductivity-type semiconductor layer 912. As illustrated in FIG. 9B, the semiconductor layers 906, 908, 910, and 912 being semiconductors having different conductivity types are alternately laminated to form a pnpn-type (or npnp-type) thyristor structure. In this embodiment, an n-type GaAs substrate is used as the substrate 900, and an n-type GaAs layer or n-type AlGaAs layer is used as the buffer layer 902. The DBR layer 904 has a laminate structure of n-type AlGaAs having a high Al composition and n-type AlGaAs having a low Al composition. As the first first-conductivity-type semiconductor layer 906 formed on the DBR layer, n-type AlGaAs is used, and as the first second-conductivity-type semiconductor layer 908, p-type AlGaAs is used. As the second first-conductivity-type semiconductor layer 910, n-type AlGaAs is used, and as the second second-conductivity-type semiconductor layer 912, p-type AlGaAs is used.

Further, the surface emitting elements of the mesa structure type use a current confinement mechanism to prevent a current from flowing to side surfaces of the mesa structures 922, thereby improving the light emitting efficiency. Now, the current confinement mechanism in this embodiment is described. As illustrated in FIG. 9B, in this embodiment, on the p-type AlGaAs being the second second-conductivity-type semiconductor layer 912, a p-type GaP layer 914 is formed, and further thereon, an n-type transparent conductor being an indium-tin oxide (ITO) layer (hereinafter referred to as "n-type ITO layer") 918 is formed. The p-type GaP layer 914 is formed so that a part to be brought into contact with the n-type ITO layer 918 has a sufficiently high impurity concentration. When a forward bias is applied to the light emitting thyristor (for example, when a back-surface electrode 926 is grounded, and a positive voltage is applied to a front-surface electrode 920), the p-type GaP layer 914 forms a tunnel junction because the part to be brought into contact with the n-type ITO layer 918 is formed to have a sufficiently high impurity concentration. As a result, current flows. With such a structure, the p-type GaP layer 914 concentrates a current in the part in contact with the n-type ITO layer 918, to thereby form the current confinement mechanism. In this embodiment, an interlayer insulating layer 916 is provided between the n-type ITO layer 918 and the p-type AlGaAs layer 912. However, an attached diode formed by the n-type ITO layer 918 and the p-type AlGaAs layer 912 has a reverse bias with respect to the forward bias of the light emitting thyristor, and a current does not basically flow in the case of the forward bias except for the tunnel junction portion. Accordingly, when the attached diode formed by the n-type ITO layer 918 and the p-type AlGaAs layer 912 has a sufficient reverse-direction withstanding voltage with respect to the required application, the interlayer insulating layer 916 can be omitted. With such a configuration, a semiconductor laminating portion below a part substantially equal to a part in which the p-type GaP layer 914 and the n-type ITO layer 918 are in contact with each other emits light, and the light emission is almost entirely reflected by the DBR layer 904 to the opposite side of the substrate 900.

In the exposure head 106 in this embodiment, the density of the light emitting points (interval between the light emitting elements) is determined based on a resolution. The individual light emitting elements inside the surface emitting element array chip are separated by the element isolation grooves 924 to have the mesa structures 922. For example, when image formation is performed at a resolution of 1,200 dpi, the light emitting elements are arrayed so that an interval between element centers of adjacent light emitting elements (light emitting points) is 21.16 µm.

[Arrangement of Surface Emitting Element Array Chips on Drive Circuit Board]

FIG. 10A, FIG. 10B, and FIG. 10C are views for illustrating a relationship at the time when the surface emitting element array chips 1 to 29 in this embodiment are arranged on the drive circuit board 202. FIG. 10A is an illustration of a case in which the drive circuit board 202 has an ideal rectangular shape. A total of 29 surface emitting element array chips are arranged so as to be shifted in a staggered configuration in two rows in the widthwise direction of the drive circuit board 202. In this case, a side on which 15 odd-numbered (first, third, . . . , twenty-seventh, twenty-ninth) surface emitting element array chips are arranged is referred to as "lower side", and a side on which 14 even-numbered (second, fourth, . . . , twenty-sixth, twenty-eighth) surface emitting element array chips are arranged is referred to as "upper side". That is, a total of 14 surface emitting element array chips are arranged on the upper side substantially in one row in the longitudinal direction, and a total of 15 surface emitting element arrays are arranged on the lower side substantially in one row in the longitudinal direction. Further, an upper-side end portion of the drive circuit board 202 in the widthwise direction is referred to as "upper end", and a lower-side end portion thereof is referred to as "lower end".

When a length in the widthwise direction of the drive circuit board 202 is represented by V, a center in the widthwise direction of the drive circuit board 202 indicated by the dotted line (hereinafter referred to as "board widthwise center") is at a position of V/2. In this case, a center in the widthwise direction of an intensity of a light amount of the surface emitting element array chip indicated by the broken line (hereinafter referred to as "light emitting center") is shifted (offset) to the even-numbered surface emitting array chip side with respect to the center in the widthwise direction of the drive circuit board 202. In this manner, a larger area can be secured for a region (hereinafter referred to as "wiring region") in which signal lines are wired for the odd-numbered surface emitting element array chips arranged in one row on the lower side on which the number of surface emitting element array chips is larger (15 chips). At this time, an amount to offset the light emitting center from the board widthwise center in the widthwise direction (hereinafter referred to as "offset amount") is determined as follows. For example, when the length V in the widthwise direction of the drive circuit board 202 is about 8.5 mm, the offset amount is set to about 1 mm or 2 mm which is an amount sufficiently larger than the design tolerance.

FIG. 10B and FIG. 10C are illustrations of a case in which the drive circuit board 202 does not have a rectangular shape. Various restrictions in arrangement of the drive circuit board 202 onto the image forming apparatus 10 may cause a case in which the drive circuit board 202 cannot be formed into an ideal rectangular shape as illustrated in FIG. 10A. In FIG. 10B, four corners of the drive circuit board 202 have a partially protruded shape in the widthwise direction. The protruded shape of one end portion in the longitudinal direction is referred to as "protruded portion 202a", and the protruded shape of another end portion is referred to as "protruded portion 202b". Now, the definition of the upper end of the drive circuit board 202 is described. A length A in the longitudinal direction of each of the protruded portions 202a and 202b of the drive circuit board 202 and a length D in the longitudinal direction excluding the protruded portions 202a and 202b of the drive circuit board 202 are compared. Here, a relationship of "D=L−2×A" is satisfied. Then, a part having a larger total value is defined as the upper end of the drive circuit board 202. The lower end of the drive circuit board 202 is defined likewise. In the case of FIG. 10B, at both of the upper end and the lower end of the drive circuit board 202, the length D excluding the protruded portions 202a and 202b is larger than the total length 2×A of the lengths A of the protruded portions 202a and 202b (D>2×A). Accordingly, in FIG. 10B, both of the upper end and the lower end are defined such that the part excluding the protruded portions 202a and 202b is the upper end or the lower end of the drive circuit board 202.

In FIG. 10C, likewise, the upper end or the lower end is defined. In FIG. 10C, the upper-end left side of the drive circuit board 202 has a protruded portion 202c, and the lower-end right side of the drive circuit board 202 has a protruded portion 202d. When the upper end of the drive circuit board 202 is to be determined, a length B in the longitudinal direction of the protruded portion 202c and a length E in the longitudinal direction of a part excluding protruded portion 202c are compared. In this case, the length E excluding the protruded portion 202c is larger than the length B (E>B), and hence the part excluding the protruded portion 202c is defined as the upper end of the drive circuit board 202. Further, when the lower end of the drive circuit board 202 is to be determined, a length C in the longitudinal direction of the protruded portion 202d and a length F in the longitudinal direction of a part excluding the protruded portion 202d are compared. In this case, the length F excluding the protruded portion 202d is larger than the length C (F>C), and hence the part excluding the protruded portion 202d is defined as the lower end of the drive circuit board 202.

In this case, in both of FIG. 10B and FIG. 10C, the board widthwise center in the widthwise direction of the drive circuit board 202 is calculated from the following expression (1) after the above-mentioned upper end and lower end of the drive circuit board 202 are determined.

Board widthwise center=(Length from upper end to lower end)/2   (1)

That is, the board widthwise center of the drive circuit board 202 refers to a center between the defined upper end and the defined lower end of the drive circuit board 202. In FIG. 10B and FIG. 10C, the board widthwise center is indicated by the dotted line. In the examples of FIG. 10B and FIG. 10C, the length from the defined upper end to the defined lower end of the drive circuit board 202 is V, and hence the board widthwise center is at a position of V/2. Meanwhile, the light emitting center indicated by the broken line is shifted by a predetermined offset amount to the even-numbered surface emitting element array chip side with respect to the board widthwise center. In this manner, a larger area can be secured for the wiring region for the (odd-numbered) surface emitting element array chips arranged in one row on the lower side on which the number of surface emitting element array chips is larger. As described above, the position of the light emitting center of the plurality of surface emitting element array chips is shifted to the side on which the even-numbered surface emitting element array chips are arranged, with respect to the board widthwise center of the drive circuit board 202.

[Wiring on Drive Circuit Board]

FIG. 11 is an enlarged view for illustrating wiring of the surface emitting element array chips (SEEACs in FIGS. 11) 23 to 27 in the drive circuit board 202. In this case, the start pulse line Φs and the transfer lines Φ1 and Φ2 are wired in common for all of the surface emitting element array chips 1 to 29, and hence description thereof is omitted here. In this embodiment, as described with reference to FIG. 6, the lighting signal lines ΦW1 to ΦW4 are connected to each of the surface emitting element array chips 1 to 29. Accordingly, the number of wiring lines required for the surface emitting element array chip 24 and the surface emitting element array chip 26 is 8 in total when limited to those two chips. Meanwhile, the number of wiring lines required for the surface emitting element array chip 23, the surface emitting element array chip 25, and the surface emitting element array chip 27 is 12 in total when limited to those three chips. Thus, the light emitting center is shifted from the board widthwise center defined by the upper end and the lower end of the drive circuit board 202 to the side on which the number of surface emitting element array chips is smaller (that is, the side of the even-numbered surface emitting element array chips). In this manner, a larger area can be secured for the wiring region on the side on which the number of surface emitting element array chips is larger (side of the odd-numbered surface emitting element array chips).

As described above, in this embodiment, when an odd number of surface emitting element array chips are arranged in a staggered configuration on the drive circuit board 202, a larger area can be secured for the wiring region on the side on which odd-numbered surface emitting element array chips are arranged, in the widthwise direction of the drive circuit board 202. This is allowed by the configuration in which the light emitting center is shifted from the board widthwise center defined by the upper end and the lower end of the drive circuit board 202 to the side on which the number of surface emitting element array chips is smaller. Accordingly, even when an odd number of surface emitting element array chips are arranged, the surface emitting element array chips can be arranged on the drive circuit board 202 without increasing the length in the widthwise direction of the drive circuit board 202.

As described above, according to the embodiment, even when an odd number of light emitting element arrays are arranged on the printed circuit board, the increase in size of the printed circuit board can be suppressed, and also wiring congestion on the printed circuit board can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An image forming apparatus, comprising:
a photosensitive member which is rotatable; and
an exposure head including:
a plurality of chips in each of which a plurality of light emitting elements configured to expose the photosensitive member are arrayed at intervals corresponding to a first resolution in an intersecting direction intersecting with a rotation direction of the photosensitive member;
a printed circuit board on which the plurality of chips are mounted;
a drive portion which is mounted on a surface of the printed circuit board opposite to a surface thereof on which the plurality of chips are mounted, and is configured to drive the plurality of light emitting elements of each of the plurality of chips, wherein the plurality of chips are arranged in a first chip array in which an even number of chips are arranged in the intersecting direction and a second chip array in which an odd number of chips are arranged in the intersecting direction, the first chip array and the second chip array are disposed side by side with respect to the rotation direction, and a difference between the even number of chips of the first chip array and the odd number of chips of the second chip array is one; and
a wiring pattern which is printed on the printed circuit board, and includes wiring patterns through which the drive portion transmits drive signals to the plurality of chips, respectively, wherein the wiring patterns include a first group of wiring patterns including wiring patterns connected to the even number of chips of the first chip array on a same side as the first chip array with respect to a center in the rotation direction of an intensity of a light amount of the plurality of light emitting elements of the plurality of chips and a second group of wiring patterns including wiring patterns connected to the odd number of chips of the second chip array on a same side as the second chip array with respect to the center,
wherein, of the first group of wiring patterns and the second group of wiring patterns, a group of wiring patterns corresponding to a chip array that has one more chip, of the first chip array and the second chip array, has more wires than another group of wiring patterns by a number of wires for one chip, and
wherein with respect to the rotation direction, a width of an area on which the group of wiring patterns, of the first group of wiring patterns and the second group of wiring patterns, having more wires than the other group of wiring patterns by the number of wires for one chip is laid is wider than a width of an area on which the other group of wiring patterns is laid.

2. The image forming apparatus according to claim 1, further comprising two drive portions,
wherein the two drive portions are arranged at positions substantially one-third of a length of the printed circuit board from both end portions in the intersecting direction of the printed circuit board, respectively.

3. The image forming apparatus according to claim 1, wherein the second chip array has one more chip than the first chip array.

* * * * *